(12) United States Patent
Hanada

(10) Patent No.: US 11,609,463 B2
(45) Date of Patent: Mar. 21, 2023

(54) DISPLAY DEVICE

(71) Applicant: Japan Display Inc., Tokyo (JP)

(72) Inventor: Akihiro Hanada, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/723,468

(22) Filed: Apr. 19, 2022

(65) Prior Publication Data

US 2022/0342264 A1    Oct. 27, 2022

(30) Foreign Application Priority Data

Apr. 21, 2021    (JP) .............................. JP2021-072049

(51) Int. Cl.
| | | |
|---|---|---|
| *G02F 1/1362* | (2006.01) | |
| *G02F 1/1343* | (2006.01) | |
| *G02F 1/1334* | (2006.01) | |
| *G02F 1/1368* | (2006.01) | |

(52) U.S. Cl.
CPC ...... *G02F 1/136209* (2013.01); *G02F 1/1334* (2013.01); *G02F 1/1368* (2013.01); *G02F 1/134309* (2013.01); *G02F 1/136227* (2013.01); *G02F 1/136286* (2013.01)

(58) Field of Classification Search
CPC ............. G02F 1/136209; G02F 1/1334; G02F 1/134309; G02F 1/136227; G02F 1/136286; G02F 1/1368
See application file for complete search history.

(56) References Cited

U.S. PATENT DOCUMENTS

| | | | |
|---|---|---|---|
| 2002/0089617 A1 * | 7/2002 | Fukata | .............. H01L 29/78621 |
| | | | 438/149 |
| 2018/0031758 A1 | 2/2018 | Mizuno et al. | |
| 2021/0286226 A1 | 9/2021 | Sugiyama et al. | |

FOREIGN PATENT DOCUMENTS

| | | |
|---|---|---|
| JP | 2018-21974 A | 2/2018 |
| JP | 2020-91400 A | 6/2020 |

* cited by examiner

*Primary Examiner* — James A Dudek
(74) *Attorney, Agent, or Firm* — Xsensus LLP

(57) ABSTRACT

According to one embodiment, a display device includes a first substrate including a scanning line, a first inorganic insulating film, an oxide semiconductor, and a first light-shielding wall. The first inorganic insulating film, in planer view, includes a first groove formed between the oxide semiconductor and a light-emitting module. The first light-shielding wall is disposed on the first groove.

16 Claims, 20 Drawing Sheets

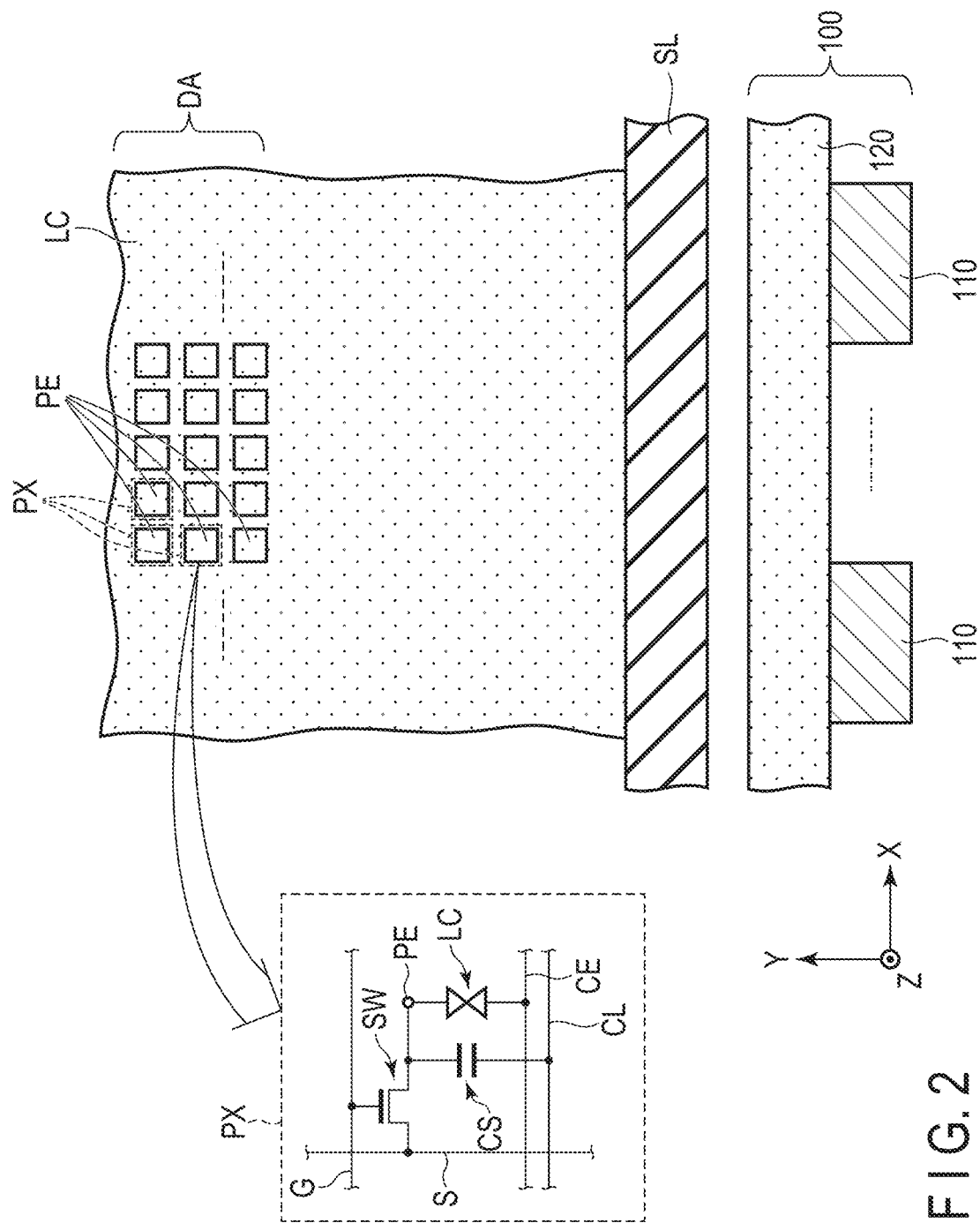
F I G. 2

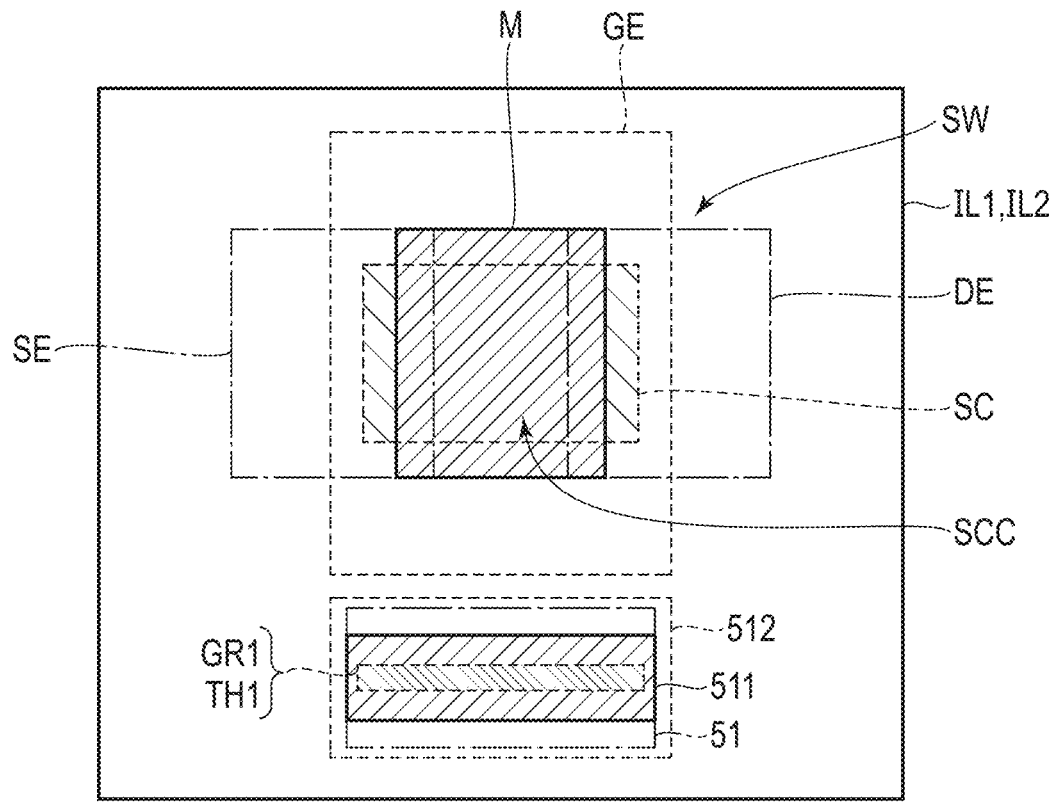
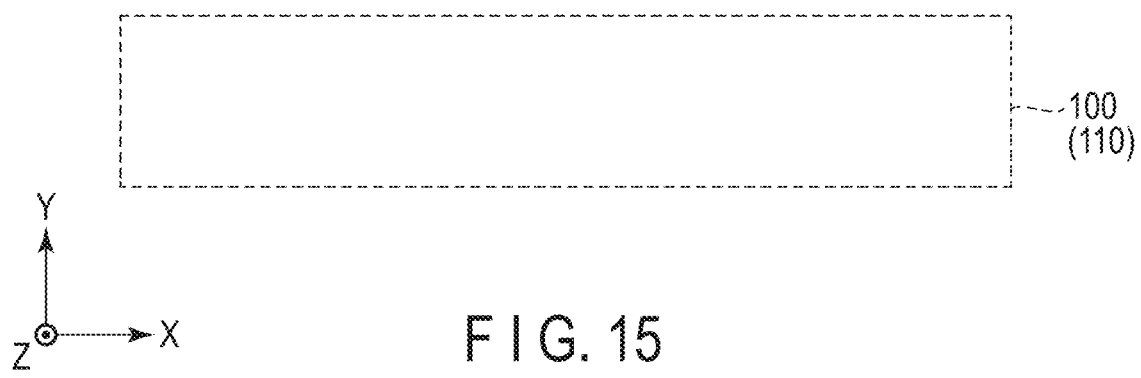
F I G. 15

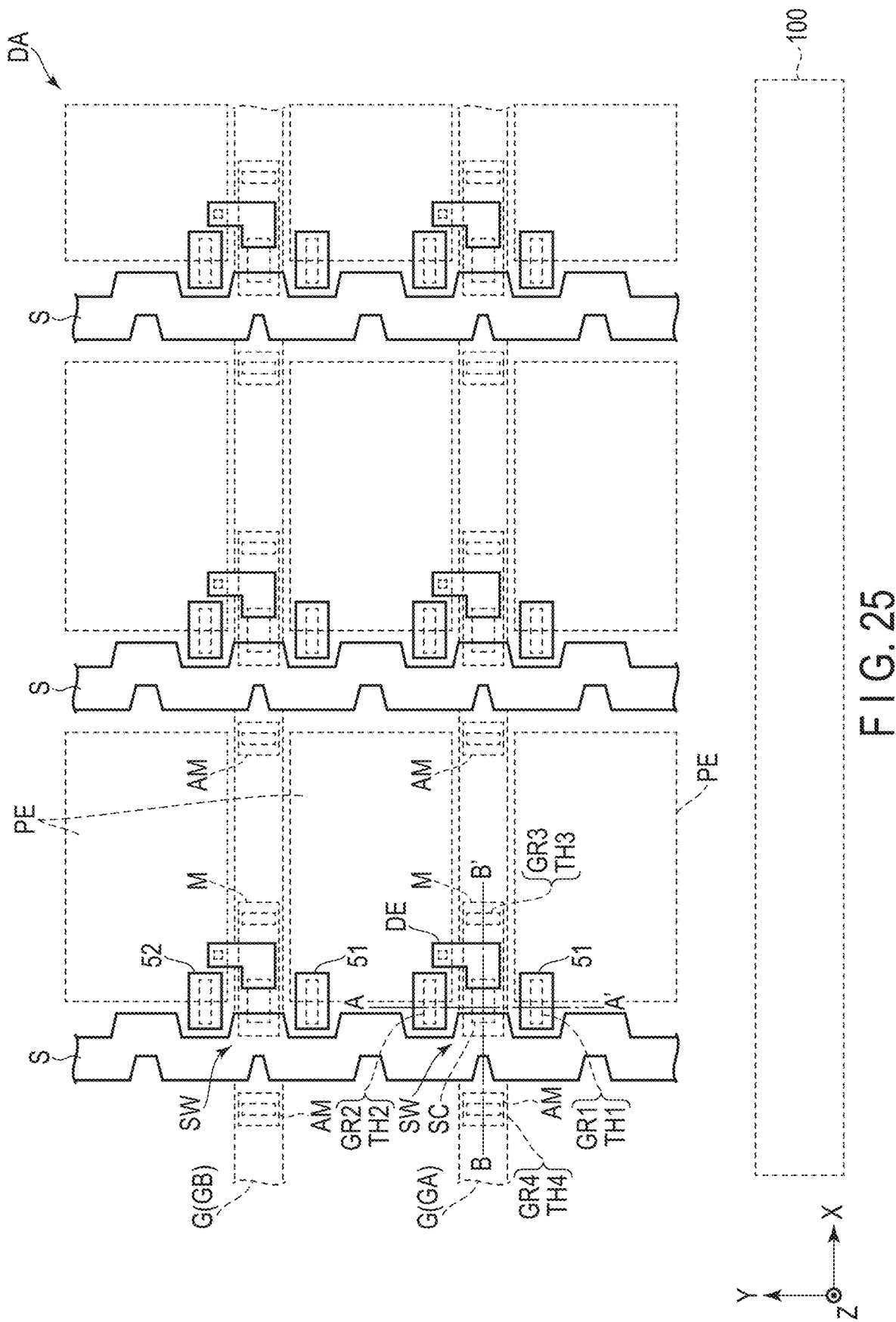
F I G. 25

DISPLAY DEVICE

CROSS-REFERENCE TO RELATED APPLICATIONS

This application is based upon and claims the benefit of priority from Japanese Patent Application No. 2021-072049, filed Apr. 21, 2021, the entire contents of which are incorporated herein by reference.

FIELD

Embodiments described herein relate generally to a display device.

BACKGROUND

In recent years, various devices using a polymer-dispersed liquid crystal capable of switching between a scattered state in which incident light is scattered and a transparent state in which incident light is transmitted have been proposed. In one example, a display device comprising a first transparent substrate, a second transparent substrate, a liquid crystal layer containing a polymer-dispersed liquid crystal sealed between the first transparent substrate and the second transparent substrate, and at least one light-emitting part facing at least one side surface of the first and second transparent substrates, is described.

BRIEF DESCRIPTION OF THE DRAWINGS

FIG. 2 is a plan view showing an area in the vicinity of a light-emitting module 100.

FIG. 15 is a diagram for explaining a modified example including a switching element SW.

FIG. 25 is a plan view showing an example of a display area DA.

DETAILED DESCRIPTION

Figure 1:
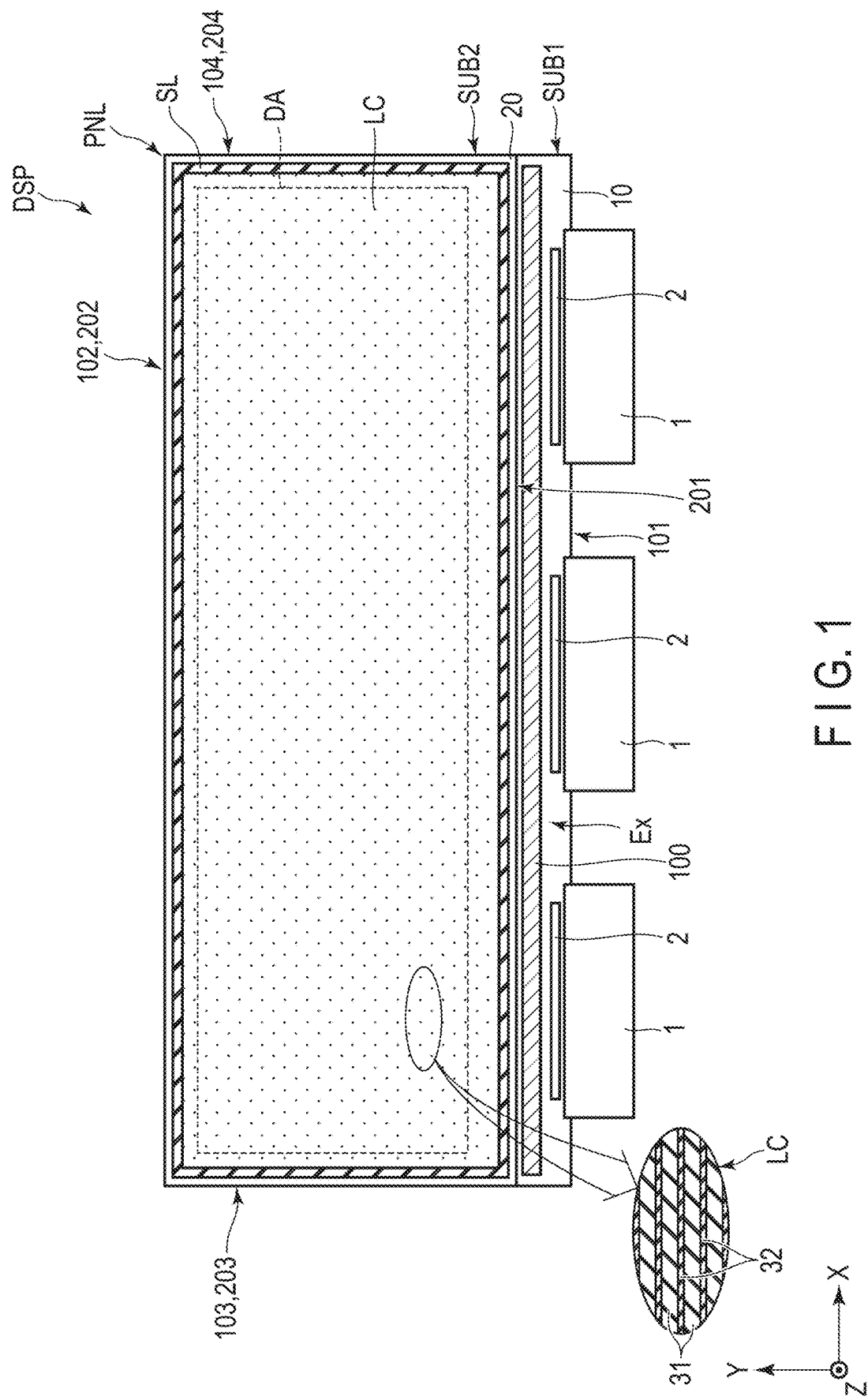
FIG. 1 is a plan view showing an example of a display device DSP of an embodiment.

In general, according to one embodiment, a display device comprises: a first substrate comprising a first transparent substrate, a scanning line disposed on the first transparent substrate, a first inorganic insulating film disposed on the scanning line, a signal line disposed on the first inorganic insulating film and intersecting the scanning line, a switching element provided with an oxide semiconductor disposed on the first inorganic insulating film and electrically connected to the scanning line and the signal line, a pixel electrode electrically connected to the switching element, and a first light-shielding wall; a second substrate comprising a second transparent substrate having a side surface, and a common electrode facing the pixel electrode; a liquid crystal layer disposed between the first substrate and the second substrate and containing a polymer-dispersed liquid crystal; and a light-emitting module disposed along the side surface, wherein the first inorganic insulating film, in planer view, includes a first groove formed between the oxide semiconductor and the light-emitting module, and the first light-shielding wall is disposed on the first groove.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a plan view schematically showing a configuration of a display device DSP according to this embodiment. For example, a first direction X, a second direction Y and a third direction Z are orthogonal to each other, but they may intersect at an angle other than 90 degrees. The first direction X and the second direction Y correspond to the directions parallel to a main surface of a substrate that constitutes the display device DSP. The third direction Z corresponds to a thickness direction of the display device DSP. In this embodiment, viewing an X-Y plane defined by the first direction X and the second direction Y is referred to as planar view.

A display device DSP comprises a display panel PNL, a wiring substrate 1, an IC chip 2, and a light-emitting module 100.

The display panel PNL comprises a first substrate SUB1, a second substrate SUB2, a liquid crystal layer LC containing polymer-dispersed liquid crystal, and a sealant SL. The first substrate SUB1 and the second substrate SUB 2 are formed in a flat plate shape along an X-Y plane. The first substrate SUB1 and the second substrate SUB 2 overlap each other in planar view. An area where the first substrate SUB1 and the second substrate SUB2 overlap includes a display area DA where images are displayed.

The first substrate SUB1 comprises a first transparent substrate 10, and the second substrate SUB2 comprises a second transparent substrate 20. The first transparent substrate 10 has side surfaces 101 and 102 along the first direction X and side surfaces 103 and 104 along the second direction Y. The second transparent substrate 20 has side surfaces 201 and 202 along the first direction X and side surfaces 203 and 204 along the second direction Y.

In the example shown in FIG. 1, the side surfaces 102 and 202, the side surfaces 103 and 203, and the side surfaces 104 and 204 overlap each other in planar view; however, they do not necessarily have to overlap. The side surface 201 does not overlap the side surface 101, and is located between the side surface 101 and the display area DA. The first substrate SUB1 has an extended portion Ex between the side surface 101 and the side surface 201. In other words, the extended portion Ex corresponds to a portion of the first substrate SUB1 that extends in the second direction Y from a portion overlapping the second substrate SUB2, and does not overlap the second substrate SUB2.

In the example shown in FIG. 1, the display panel PNL is formed in a rectangular shape extending in the first direction X. In other words, the side surfaces 101 and 102 and the side surfaces 201 and 202 are the side surfaces along the long side of the display panel PNL, and the side surfaces 103 and 104 and the side surfaces 203 and 204 are the side surfaces along the short side of the display panel PNL. Note that the display panel PNL may be formed in a rectangular shape extending in the second direction Y, or in a square shape, or in any other polygonal shape, or in any other shape such as a circular shape or an elliptical shape.

The wiring substrate 1 and the IC chip 2 are mounted on the extended portion Ex. The wiring substrate 1 is, for example, a flexible printed circuit board that can be bent. The IC chip 2 incorporates, for example, a display driver that outputs signals necessary for image display. Note that the IC chip 2 may be mounted on the wiring substrate 1. In the example shown in FIG. 1, a plurality of wiring substrates 1 arranged in the first direction X are mounted on the display panel PNL; however, a single wiring substrate 1 extending in the first direction X may also be mounted thereon. Furthermore, a plurality of IC chips 2 arranged in the first direction X are mounted on the display panel PNL; however, a single IC chip 2 extending in the first direction X may also be mounted thereon.

Details of the light-emitting module 100 will be described later; however, in planar view, the light-emitting module 100 overlaps the extended portion Ex and is disposed along the side surface 201 of the second transparent substrate 20.

The sealant SL adheres the first substrate SUB1 and the second substrate SUB2. Furthermore, the sealant SL is formed in the shape of a rectangular frame and surrounds the liquid crystal layer LC between the first substrate SUB1 and the second substrate SUB2.

The liquid crystal layer LC is held between the first substrate SUB1 and the second substrate SUB2. The liquid crystal layer LC as such is disposed over an area surrounded by the sealant SL (including the display area DA) in planar view.

As shown schematically and enlarged in FIG. 1, the liquid crystal layer LC includes a polymer 31 and a liquid crystal molecule 32. In one example, the polymer 31 is a liquid crystalline polymer. The polymer 31 is formed in the form of stripes extending along the first direction X and is arranged in the second direction Y. The liquid crystal molecule 32 is dispersed in gaps of the polymer 31, and the long axis thereof is initially aligned along the first direction X. Each of the polymer 31 and liquid crystal molecule 32 has optical anisotropy or refractive index anisotropy. The responsiveness of the polymer 31 to electric fields is lower than that of liquid crystal molecule 32 to electric fields.

In one example, the alignment direction of the polymer 31 hardly changes with or without an electric field. On the other hand, the alignment direction of the liquid crystal molecule 32 changes in response to the electric field when in a state where a voltage higher than or equal to a threshold is applied to the liquid crystal layer LC. In the state where no voltage is applied to the liquid crystal layer LC (initial alignment state), the optical axes of the polymer 31 and liquid crystal molecule 32 are substantially parallel to each other, and light incident on the liquid crystal layer LC is almost completely transmitted through the liquid crystal layer LC (transparent state). In a state where a voltage is applied to the liquid crystal layer LC, the alignment direction of the liquid crystal molecules 32 changes, and the optical axes of the polymer 31 and liquid crystal molecules 32 intersect each other. Therefore, the light incident on the liquid crystal layer LC is scattered within the liquid crystal layer LC (scattered state).

FIG. 2 is a plan view showing an area in the vicinity of the light-emitting module 100. The light-emitting module 100 comprises a plurality of light-emitting elements 110 and a light guide 120. The plurality of light-emitting elements 110 are arranged along the first direction X. The light guide 120 is formed in the form of a rod extending in the first direction X. The light guide 120 is located between the sealant SL and the light-emitting elements 110.

The display area DA comprises a plurality of pixels PX arranged in a matrix in the first direction X and the second direction Y. These pixels PX are shown by dotted lines in the drawing. Furthermore, each of the pixels PX comprises a pixel electrode PE shown by a solid square in the drawing.

As enlarged in FIG. 2, each pixel PX comprises a switching element SW. The switching element SW is, for example, configured by a thin-film transistor (TFT), and is electrically connected to a scanning line G and a signal line S. The scanning line G is electrically connected to the switching element SW in each of the pixels PX arranged in the first direction X. The signal line S is electrically connected to the switching element SW in each of the pixels PX arranged in the second direction Y. The pixel electrode PE is electrically connected to the switching element SW.

A common electrode CE and a power supply line CL are disposed over the display area DA and its peripheral areas. A predetermined voltage Vcom is applied to the common electrode CE. A voltage of the same potential as the common electrode CE, for example, is applied to the power supply line CL.

Each of the pixel electrodes PE faces the common electrode CE in the third direction Z. In the display area DA, the liquid crystal layer LC (in particular, the liquid crystal molecules 32) is driven by an electric field generated between the pixel electrode PE and the common electrode CE. A capacitance CS is formed, for example, between the power supply line CL and the pixel electrode PE.

Figure 3:
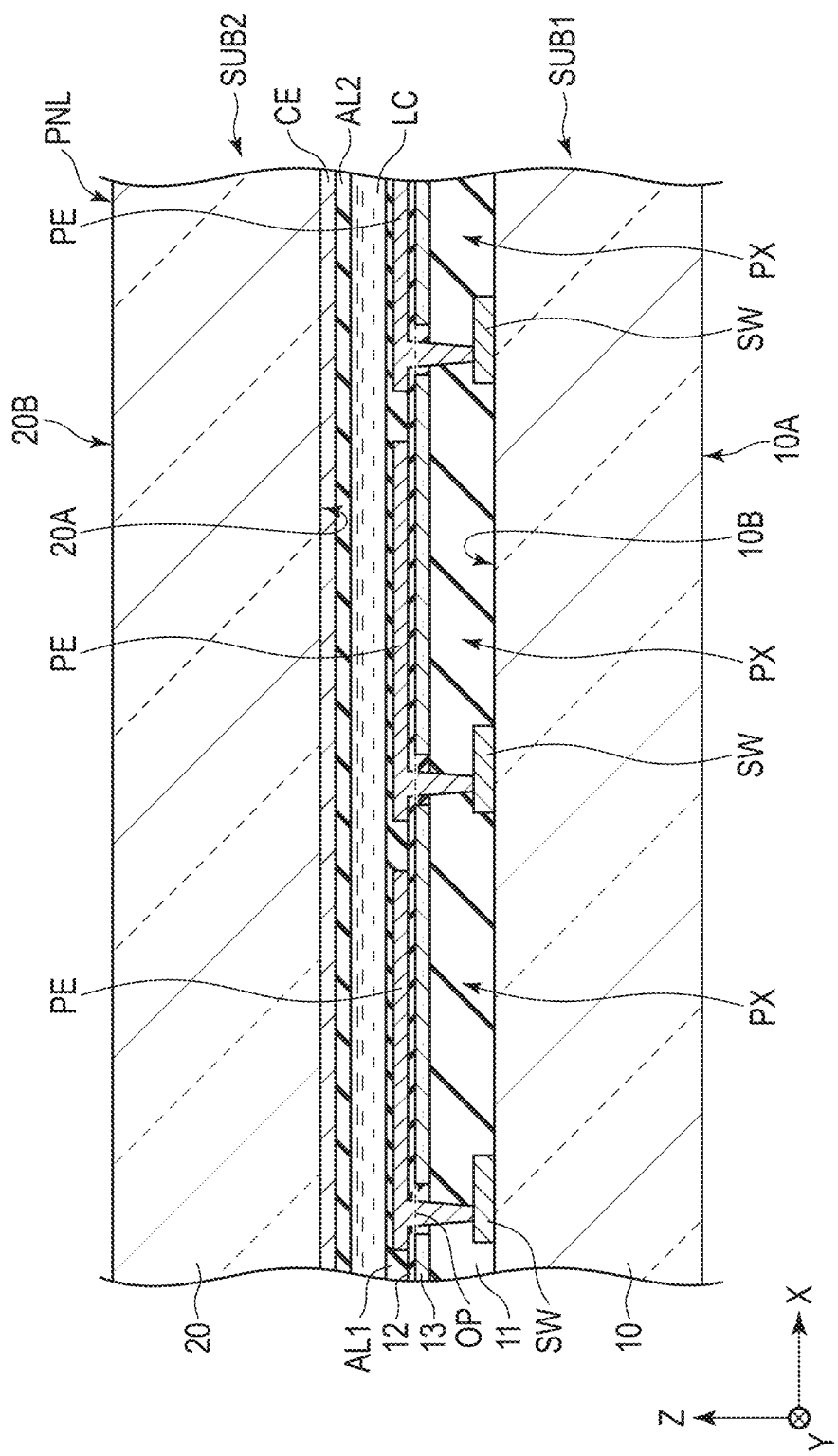
FIG. 3 is a cross-sectional view showing a configuration example of a display panel PNL shown in FIG. 1.

FIG. 3 is a cross-sectional view showing a configuration example of the display panel PNL shown in FIG. 1.

The first substrate SUB1 comprises the first transparent substrate 10, insulating films 11 and 12, a capacitance electrode 13, the switching element SW, the pixel electrode PE, and an alignment film AL1. The first transparent substrate 10 has a main surface (outer surface) 10A and a main surface (inner surface) 10B on the opposite side of the main surface 10A. The switching element SW is disposed on the main surface 10B side of the first transparent substrate 10. The insulating film 11 is disposed on the first transparent substrate 10 and the switching element SW. Note that the scanning line G and the signal line S shown in FIG. 2 are disposed between the first transparent substrate 10 and the insulating film 11, but are not shown here.

The capacitance electrode 13 is electrically connected to the power supply line CL shown in FIG. 2, and is disposed between the insulating films 11 and 12. The pixel electrode PE is disposed between the insulating film 12 and the alignment film AL1 for each pixel PX. The pixel electrode PE is electrically connected to the switching element SW via an opening OP of the capacitance electrode 13. The pixel electrode PE overlaps the capacitance electrode 13 with the insulating film 12 interposed therebetween to form the capacitance CS of the pixel PX. The alignment film AL1 covers the pixel electrode PE. The alignment film AL1 is in contact with the liquid crystal layer LC.

The second substrate SUB2 comprises the second transparent substrate 20, the common electrode CE, and an alignment film AL2. The second transparent substrate 20 has a main surface (inner surface) 20A and a main surface (outer surface) 20B on the opposite side of the main surface 20A. The main surface 20A of the second transparent substrate 20 faces the main surface 10B of the first transparent substrate 10. The common electrode CE is disposed on the main surface 20A. The alignment film AL2 covers the common electrode CE. The alignment film AL2 is in contact with the liquid crystal layer LC.

In the second substrate SUB2, a light-shielding layer may be provided directly above the switching element SW, the scanning line G, and the signal line S, respectively. In addition, a transparent insulating film may be provided between the second transparent substrate 20 and the common electrode CE, or between the common electrode CE and the alignment film AL2. The common electrode CE is disposed over a plurality of pixels PX and faces a plurality of pixel electrodes PE in the third direction Z. Furthermore, the common electrode CE is electrically connected to the capacitance electrode 13 and is at the same potential as the capacitance electrode 13.

The liquid crystal layer LC is located between the pixel electrodes PE and the common electrode CE.

The first transparent substrate 10 and the second transparent substrate 20 are, for example, glass substrates, but may also be insulating substrates such as plastic substrates. The insulating film 11 is configured by at least one of a transparent inorganic insulating film such as silicon oxide, silicon nitride, or silicon oxynitride, and a transparent organic insulating film such as acrylic resin. The insulating film 12 is a transparent inorganic insulating film such as silicon nitride. The capacitance electrode 13, the pixel electrode PE, and the common electrode CE are transparent electrodes formed of transparent conductive materials such as indium tin oxide (ITO) and indium zinc oxide (IZO). The alignment films AL1 and AL2 are horizontal alignment films having an alignment control force substantially parallel to the X-Y plane. In one example, the alignment films AL1 and AL2 are applied an alignment treatment along the first direction X. Note that the alignment treatment may be a rubbing treatment or an optical alignment treatment.

CONFIGURATION EXAMPLE 1

Figure 4:
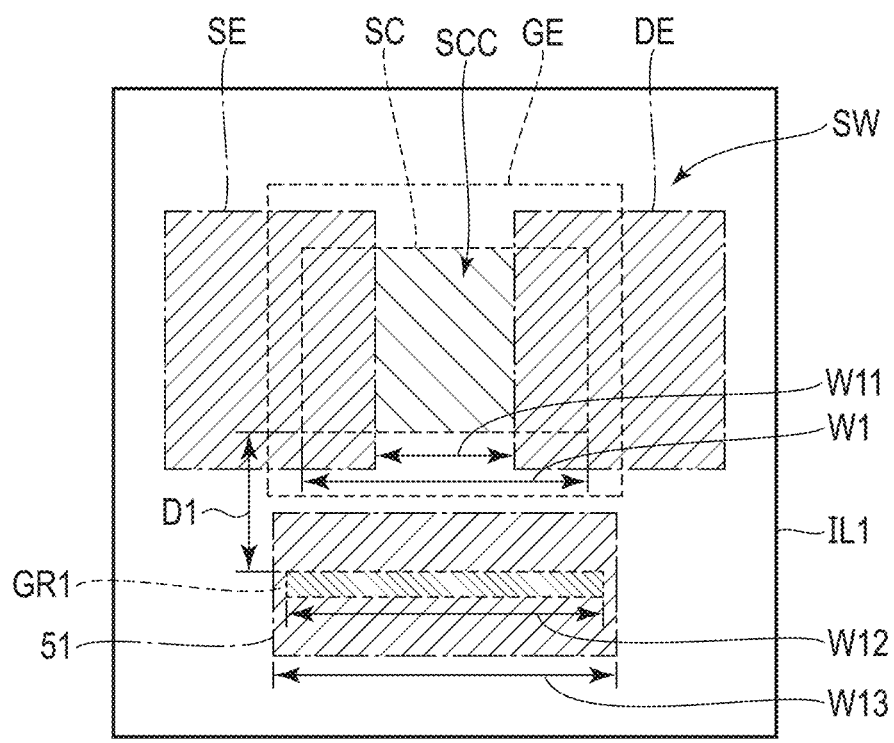
FIG. 4 is a diagram for explaining Configuration Example 1 including a switching element SW.
Figure 4:
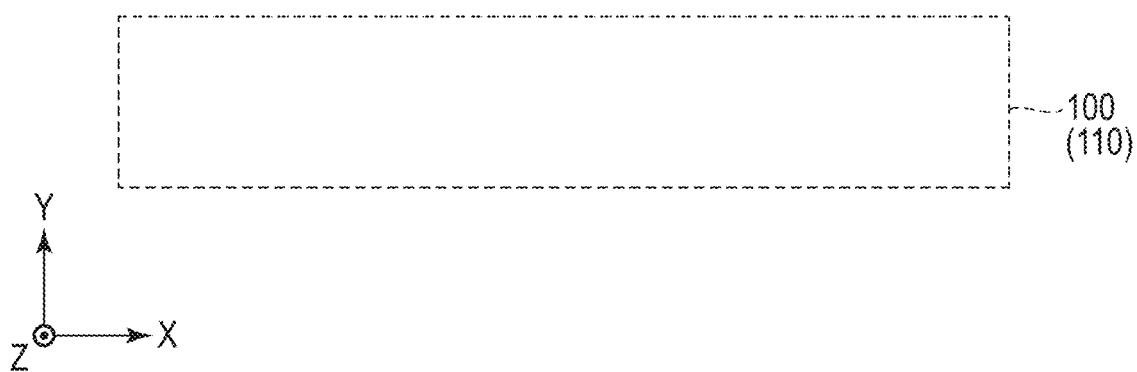

FIG. 4 is a diagram for explaining Configuration Example 1 including the switching element SW.

The switching element SW comprises an oxide semiconductor SC, a gate electrode GE, a source electrode SE, and a drain electrode DE. The gate electrode GE is electrically connected to the scanning line G. The oxide semiconductor SC overlaps the gate electrode GE. The source electrode SE is in contact with the oxide semiconductor SC and is electrically connected to the signal line S. The drain electrode DE is in contact with the oxide semiconductor SC and is electrically connected to the pixel electrode PE.

The source electrode SE and the drain electrode DE are arranged at intervals in the first direction X. In the oxide semiconductor SC, an area between the source electrode SE and the drain electrode DE corresponds to a channel SCC. The oxide semiconductor SC has a width W1 in the first direction X. Furthermore, the channel SCC has a width W11 in the first direction X. The width W11 is smaller than the width W1 (W11<W1).

A first inorganic insulating film IL1 is interposed between the gate electrode GE and the oxide semiconductor SC. The first inorganic insulating film IL1 has a first groove GR1. The first groove GR1 extends in the first direction X. The first groove GR1 is located between the oxide semiconductor SC and the light-emitting module 100 (or the light-emitting element 110) in the second direction Y, and is proximate to the oxide semiconductor SC. The first groove GR1 has a width W12 in the first direction X. The width W12 of the first groove GR1 is larger than the width W11 of the channel SCC (W12>W11).

A first light-shielding wall 51 is disposed in a manner filling the entire first groove GR1. The first light-shielding wall 51 extends in the first direction X. The first light-shielding wall 51 has a width W13 in the first direction X. In the example shown in FIG. 4, the width W13 of the first light-shielding wall 51 is larger than the width W12 of the first groove GR1 (W13>W12), and the width W13 is larger than the width W11 (W13>W11). Note that the width W13 of the first light-shielding wall 51 may be smaller than the width W12 of the first groove GR1 (W12>W13). However, the relationship that the width W13 of the first light-shielding wall 51 is larger than the width W11 (W13>W11) remains unchanged.

One end portion of each of the first groove GR1 and the first light-shielding wall 51 extending in the first direction X faces the source electrode SE in the second direction Y. In addition, the other end portion of each of the first groove GR1 and the first light-shielding wall 51 faces the drain electrode DE in the second direction Y. In the illustrated example, the first light-shielding wall 51 is separated from both the source electrode SE and the drain electrode DE.

The channel SCC faces the first groove GR1 and the first light-shielding wall 51 in the second direction Y. An interval D1 along the second direction Y between the oxide semiconductor SC and the first groove GR1 is smaller than a pixel pitch or a scanning line pitch in the second direction Y and is, for example, 1 to 25 µm.

Embodiment 1 will now be described.

Figure 5:
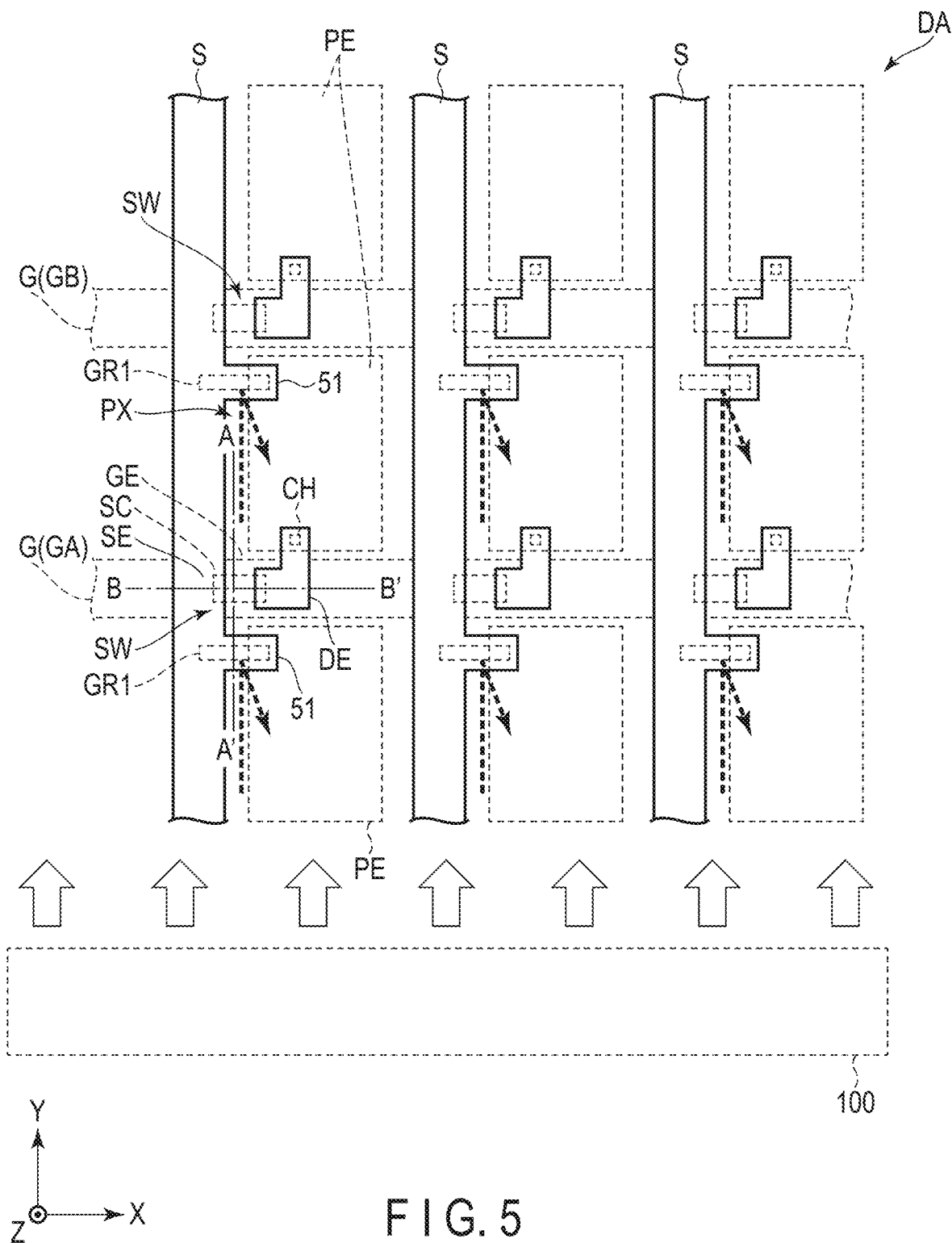
FIG. 5 is a plan view showing an example of a display area DA.

FIG. 5 is a plan view showing an example of the display area DA. Here, only a main part included in the first substrate SUB1 is shown.

A plurality of scanning lines G each extend in the first direction X. A plurality of signal lines S each extend in the second direction Y and intersect the plurality of scanning lines G. In the present specification, the pixel PX corresponds to an area surrounded by two adjacent scanning lines G and two adjacent signal lines S. The switching element SW is located near the intersection of the scanning line G and the signal line S. Alternatively, the switching element SW may be disposed in a manner to overlap the intersection of the scanning line G and the signal line S.

In the switching element SW, the gate electrode GE is formed integrally with the scanning line G, and the source electrode SE is formed integrally with the signal line S. The drain electrode DE is formed collectively with the source electrode SE and the signal line S. Furthermore, the first light-shielding wall 51 is formed integrally with the signal line S. Note that the first light-shielding wall 51 may be separated from the signal line S. The drain electrode DE is in contact with the pixel electrode PE at a contact hole CH. The contact hole CH overlaps the opening OP shown in FIG. 3 and corresponds to a through hole in the insulating film 11.

In each pixel PX, the first light-shielding wall 51 or the first groove GR1 is located between the two adjacent scanning lines G. For example, if the two scanning lines G shown in the drawing are distinguished as scanning lines GA and GB, the scanning line GA is a scanning line located on a side close to the light-emitting module 100, and is located between the scanning line GB and the light-emitting module 100. Focusing on the first light-shielding wall 51 and the first groove GR1 located between the scanning line GA and the scanning line GB, these first light-shielding wall 51 and first groove GR1 are close to the scanning line GB (the scanning line on the far side from the light-emitting module 100). In other words, in the second direction Y, the distance between the first light-shielding wall 51 and the scanning line GB is smaller than the distance between the first light-shielding wall 51 and the scanning line GA. Alternatively, in the second direction Y, the distance between the first groove GR1 and the scanning line GB is smaller than the distance between the first groove GR1 and the scanning line GA.

A pitch of the first light-shielding walls 51 (or the first grooves GR1) arranged in the second direction Y is equivalent to a pitch of the pixel electrodes PE arranged in the second direction Y (hereinafter referred to as a pixel pitch), and is also equivalent to a pitch of the scanning lines G arranged in the second direction Y. The interval between the oxide semiconductor SC and the first light-shielding wall 51 (or the first groove GR1) is smaller than the pixel pitch in the second direction Y and smaller than the pitch of the scanning lines G.

In such a layout, an illumination light emitted from the light-emitting module 100 travels along the second direction Y as shown by the dotted arrows, and is blocked by the first light-shielding wall 51 in the vicinity of the switching element SW. This prevents the illumination light from reaching the switching element SW, especially the oxide semiconductor SC.

Figure 6:
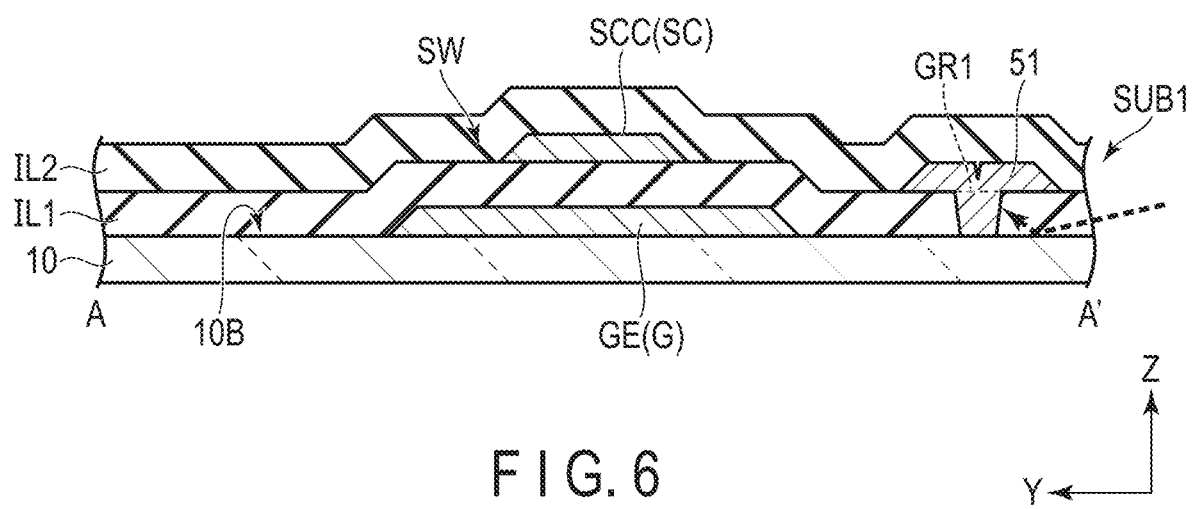
FIG. 6 is a cross-sectional view of a first substrate SUB1 including a switching element SW and a first light-shielding wall 51 along line A-A' shown in FIG. 5.
Figure 7:
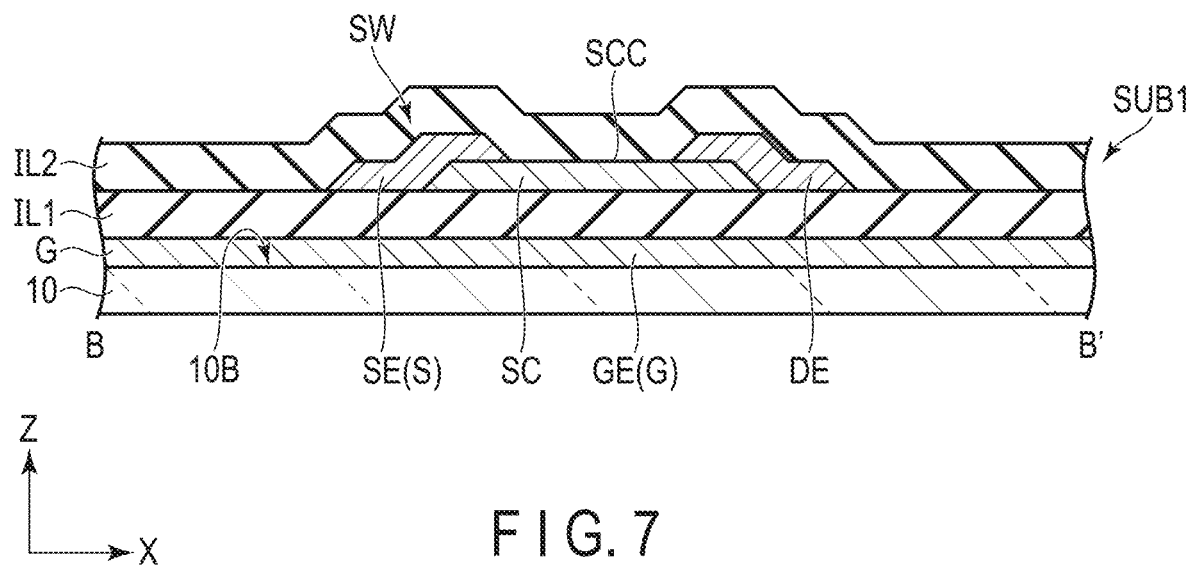
FIG. 7 is a cross-sectional view of the first substrate SUB1 including the switching element SW along the line B-B' shown in FIG. 5.

FIG. 6 is a cross-sectional view of the first substrate SUB1 including the switching element SW and the first light-shielding wall 51 along line A-A' shown in FIG. 5. FIG. 7 is a cross-sectional view of the first substrate SUB1 including the switching element SW along line B-B' shown in FIG. 5.

The scanning line G and the gate electrode GE are disposed on the main surface 10B of the first transparent substrate 10. The first inorganic insulating film IL1 is disposed on the main surface 10B and is also disposed on the scanning line G and the gate electrode GE. The oxide semiconductor SC including the channel SCC is disposed on the first inorganic insulating film IL1.

The signal line S and the source electrode SE are disposed on the first inorganic insulating film IL1 and intersect the scanning line G. The drain electrode DE is disposed on the first inorganic insulating film IL1. The source electrode SE and the drain electrode DE are in contact with the oxide semiconductor SC, respectively. The source electrode SE and the drain electrode DE are formed of the same material. In the oxide semiconductor SC, an area in contact with the source electrode SE and the drain electrode DE has a lower resistance than the channel SCC.

In the first inorganic insulating film IL1, the first groove GR1 penetrates to the first transparent substrate 10. The first light-shielding wall 51 is disposed in the first groove GR1 and is in contact with the first transparent substrate 10. Of the first light-shielding wall 51, a portion filled in the first groove GR1 corresponds to a portion that blocks the light propagating through the first inorganic insulating film IL1. The first light-shielding wall 51 is located in the same layer as the source electrode SE and the drain electrode DE, and is formed of the same material as the source electrode SE and the drain electrode DE. Although not shown, a lower light-shielding wall integrally formed with the scanning line G may be disposed directly under the first groove GR1, as described later in FIG. 15 to FIG. 17.

A second inorganic insulating film IL2 is disposed on the first inorganic insulating film IL1. The second inorganic insulating film IL2 is also disposed on the signal line S, the source electrode SE, the drain electrode DE, the channel SCC of the oxide semiconductor SC, and the first light-shielding wall 51. Here, upper layers above the second inorganic insulating film IL2 are not shown; however, for example, an organic insulating film is disposed on the second inorganic insulating film IL2, and these organic insulating film and second inorganic insulating film IL2 correspond to the insulating film 11 shown in FIG. 3.

The scanning line G, the gate electrode GE, the signal line S, the source electrode SE, and the drain electrode DE are made of, for example, metal materials such as aluminum (Al), titanium (Ti), molybdenum (M), tungsten (W), silver (Ag), copper (Cu), and chromium (Cr), or an alloy combining these metal materials.

The first light-shielding wall 51 is formed of the same material as the signal line S, etc., and is configured by, for example, a titanium-based material/aluminum-based material/titanium-based material stacked layer body. Note that the material used to form the first light-shielding wall 51 is not limited to the above example. From the viewpoint of suppressing stray light due to reflection, it is desirable that the first light-shielding wall 51 is formed of a material with low reflectivity such as titanium, molybdenum, and tungsten.

Each of the first inorganic insulating film IL1 and the second inorganic insulating film IL2 may be a single layer body or a stacked layer body. However, it is desirable that the first inorganic insulating film IL1 and the second inorganic insulating film IL2 include an oxide layer in contact with the oxide semiconductor SC. Such an oxide layer supplies oxygen to the oxide semiconductor SC and promotes oxidation or high resistance of the oxide semiconductor SC.

In one example, the first inorganic insulating film IL1 has a silicon nitride layer as the lower layer (the layer in contact with the scanning line G) and a silicon oxide layer as the upper layer (the layer in contact with the oxide semiconductor SC). The lower layer is thicker than the upper layer. For example, the thickness of the lower layer is about 300 nm, the thickness of the upper layer is about 200 nm, and the total thickness of the first inorganic insulating film IL1 is about 500 nm.

The second inorganic insulating film IL2 has a silicon oxide layer as the lower layer (the layer in contact with the channel SCC) and a silicon nitride layer as the upper layer. The lower layer is thicker than the upper layer. For example, the thickness of the lower layer is about 300 nm, the thickness of the upper layer is about 100 nm, and the total thickness of the second inorganic insulating film IL2 is about 400 nm.

According to the example described above, among the illumination light, a light propagating through the first inorganic insulating film IL1 is blocked by the first light-shielding wall 51. Therefore, the degradation of the oxide semiconductor SC by the illumination light is suppressed. As a result, an undesired shift of the threshold voltage in the switching element SW is suppressed, and the degradation of reliability can be suppressed.

Note that the first groove GR1 of the first inorganic insulating film IL1 is formed at the same time as forming contact holes to electrically connect a wiring line in the same layer as the signal line S and a wiring line in the same layer as the scanning line G outside the display area DA. In addition, the first light-shielding wall 51 is formed in the same process as the signal line S, etc. Therefore, a separate process for forming the first light-shielding wall 51 is unnecessary, and the increase in the number of manufacturing processes is suppressed.

Next, other configuration examples will be described. Note that descriptions may be omitted for the same configuration.

CONFIGURATION EXAMPLE 2

Figure 8:
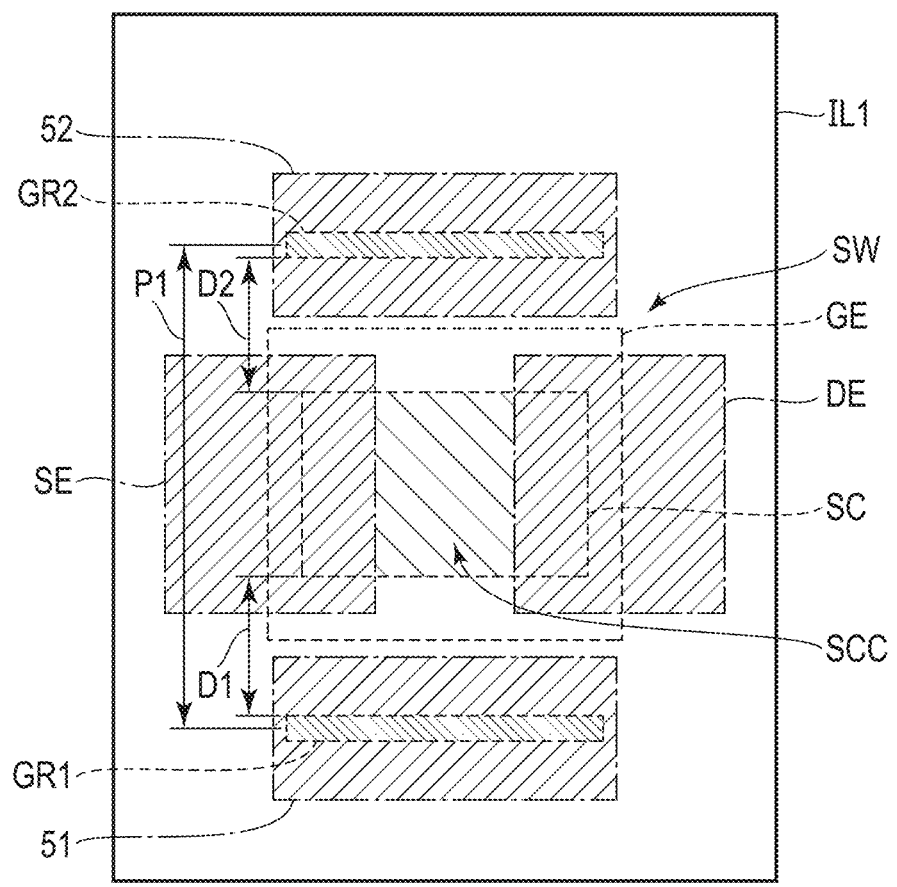
FIG. 8 is a diagram for explaining Configuration Example 2 including a switching element SW.
Figure 8:

FIG. 8 is a diagram for explaining Configuration Example 2 including the switching element SW.

Configuration Example 2 differs from Configuration Example 1 in that a second light-shielding wall 52 is further disposed. The configuration of the switching element SW is the same as in Configuration Example 1 described with reference to FIG. 4.

A first inorganic insulating film IL1 has a second groove GR2. The second groove GR2 extends in the first direction X and is almost parallel to a first groove GR1. An oxide semiconductor SC is located between the first groove GR1 and the second groove GR2 in the second direction Y. The second groove GR2 has the same width as the first groove GR1.

The second light-shielding wall 52 is disposed in a manner filling the entire second groove GR2. The second light-shielding wall 52 extends in the first direction X and is almost parallel to the first light-shielding wall 51. The oxide semiconductor SC is located between the first light-shielding wall 51 and the second light-shielding wall 52 in the second direction Y. The second light-shielding wall 52 has the same width as the first light-shielding wall 51.

One end portion of each of the second groove GR2 and the second light-shielding wall 52 extending in the first direction X faces a source electrode SE in the second direction Y. In addition, the other end portion of each of the second groove GR2 and the second light-shielding wall 52 faces a drain electrode DE in the second direction Y. In the illustrated example, the second light-shielding wall 52 is separated from both the source electrode SE and the drain electrode DE.

A channel SCC faces the second groove GR2 and the second light-shielding wall 52 in the second direction Y. An interval D2 along the second direction Y between the oxide semiconductor SC and the second groove GR2 is equivalent to the interval D1, and is, for example, 1 to 25 µm.

In addition, a pitch P1 between the first light-shielding wall 51 and the second light-shielding wall 52 along the second direction Y is smaller than a pixel pitch or a scanning line pitch in the second direction Y.

Embodiment 2 will now be described.

Figure 9:
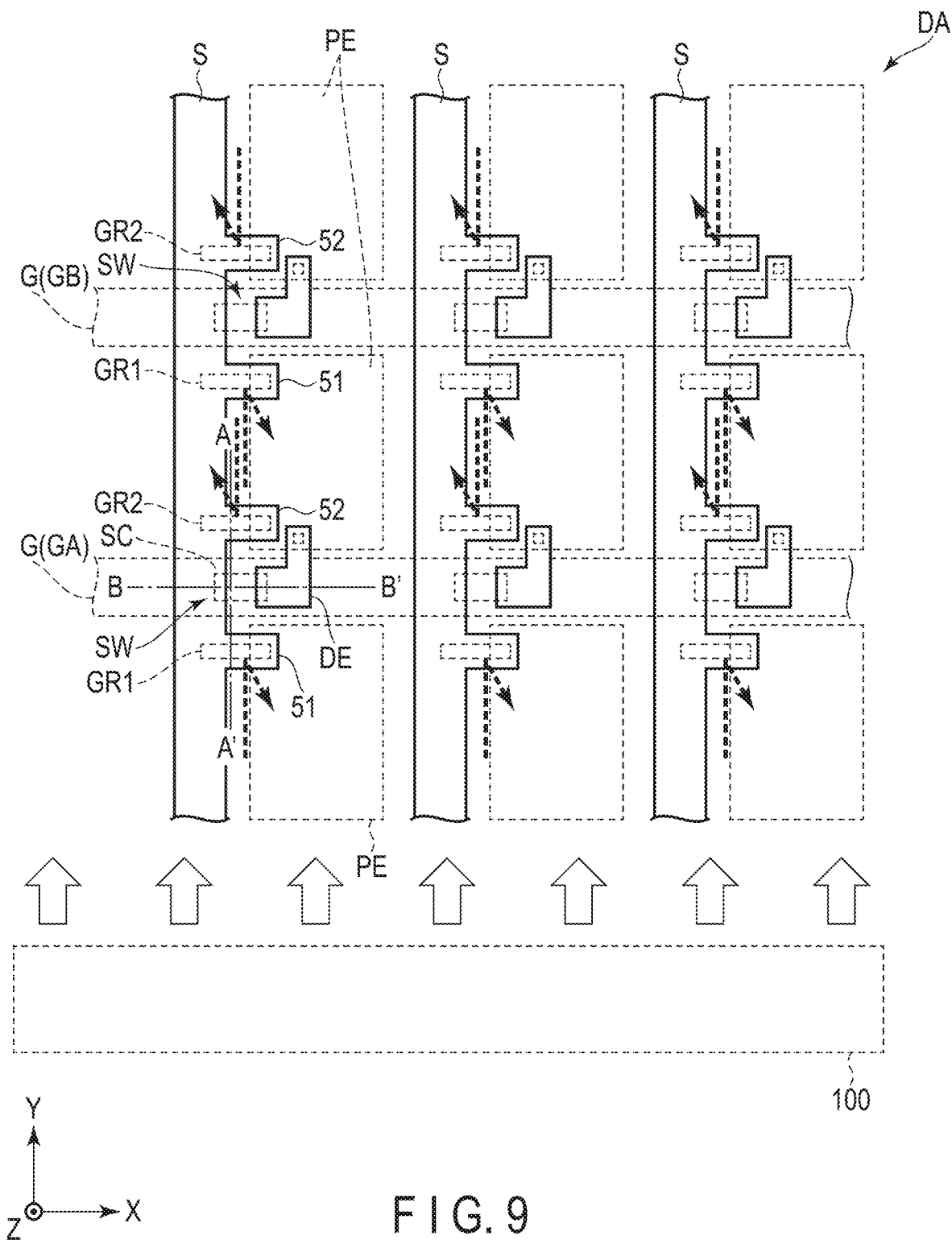
FIG. 9 is a plan view showing an example of a display area DA.

FIG. 9 is a plan view showing an example of the display area DA. Here, only a main part included in the first substrate SUB1 is shown.

The first light-shielding wall 51 and the second light-shielding wall 52 are integrally formed with the signal line S. Note that the first light-shielding wall 51 and the second light-shielding wall 52 may be separated from the signal line S.

In each pixel PX, the first light-shielding wall 51 (or the first groove GR 1) and the second light-shielding wall 52 (or the second groove GR2) are located between two adjacent scanning lines G. For example, focusing on the second light-shielding wall 52 and the second groove GR2 located between scanning lines GA and GB, these second light-shielding wall 52 and second groove GR2 are close to the scanning line GA (the scanning line on a side close to the light-emitting module 100). In other words, in the second direction Y, the distance between the second light-shielding wall 52 and the scanning line GB is greater than the distance between the second light-shielding wall 52 and the scanning line GA. Alternatively, in the second direction Y, the distance between the second groove GR2 and the scanning line GB is greater than the distance between the second groove GR2 and the scanning line GA.

Furthermore, the first light-shielding wall 51 is located between the second light-shielding wall 52 and the scanning line GB in the second direction Y, and the second light-shielding wall 52 is located between the scanning line GA and the first light-shielding wall 51 in the second direction Y. A pitch between the first light-shielding wall 51 and the second light-shielding wall 52 between the scanning line GA and the scanning line GB is larger than a pitch between the first light-shielding wall 51 and the second light-shielding wall 52 sandwiching the scanning line GA.

A pitch of the second light-shielding walls 52 (or the second grooves GR2) arranged in the second direction Y is equivalent to a pixel pitch in the second direction Y, and is also equivalent to a pitch of the scanning lines G arranged in the second direction Y. An interval between the oxide semiconductor SC and the second light-shielding wall 52 (or the second groove GR2) is smaller than the pixel pitch in the second direction Y and smaller than the pitch of the scanning lines G.

Furthermore, a pitch between the first light-shielding wall 51 (or the first groove GR1) and the second light-shielding wall 52 (or the second groove GR2) sandwiching one oxide semiconductor SC is smaller than the pixel pitch in the second direction Y and smaller than the pitch of the scanning lines G.

In such a layout, an illumination light emitted from the light-emitting module 100 travels along the second direction Y as shown by the dotted arrows, and is blocked by the first light-shielding wall 51 in the vicinity of the switching element SW. Even if the illumination light is reflected by the first light-shielding wall 51, the reflected light is blocked by the second light-shielding wall 52 in the vicinity of the switching element SW. This prevents the illumination light from reaching the switching element SW, especially the oxide semiconductor SC.

Figure 10:
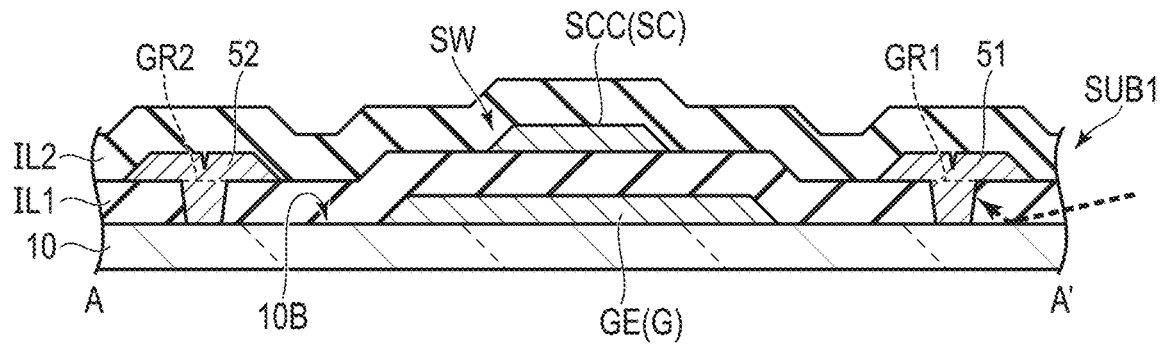
FIG. 10 is a cross-sectional view of a first substrate SUB1 including a switching element SW, a first light-shielding wall 51, and a second light-shielding wall 52 along line A-A' shown in FIG. 9.

FIG. 10 is a cross-sectional view of the first substrate SUB1 including the switching element SW, the first light-shielding wall 51, and the second light-shielding wall 52 along line A-A' shown in FIG. 9. Note that the cross section along line B-B' shown in FIG. 9 is as shown in FIG. 7; therefore, the drawing thereof is omitted.

In the first inorganic insulating film IL1, each of the first groove GR1 and the second groove GR2 penetrates to the first transparent substrate 10. The second light-shielding wall 52 is disposed in the second groove GR2 and is in contact with the first transparent substrate 10. Of the second light-shielding wall 52, a portion filled in the second groove GR2 corresponds to a portion that blocks the light propagating through the first inorganic insulating film IL1. The second light-shielding wall 52 is located in the same layer as the source electrode SE and the drain electrode DE, and is formed of the same material as the source electrode SE and the drain electrode DE. A second inorganic insulating film IL2 is disposed on the second light-shielding wall 52.

According to the example described above, among the illumination light, the light propagating through the first inorganic insulating film IL1 is blocked by the first light-shielding wall 51. Also, of the reflected light reflected by the adjacent first light-shielding wall 51, the light propagating through the first inorganic insulating film IL1 is blocked by the second light-shielding wall 52. Therefore, the same effect as described above can be obtained.

CONFIGURATION EXAMPLE 3

Figure 11:
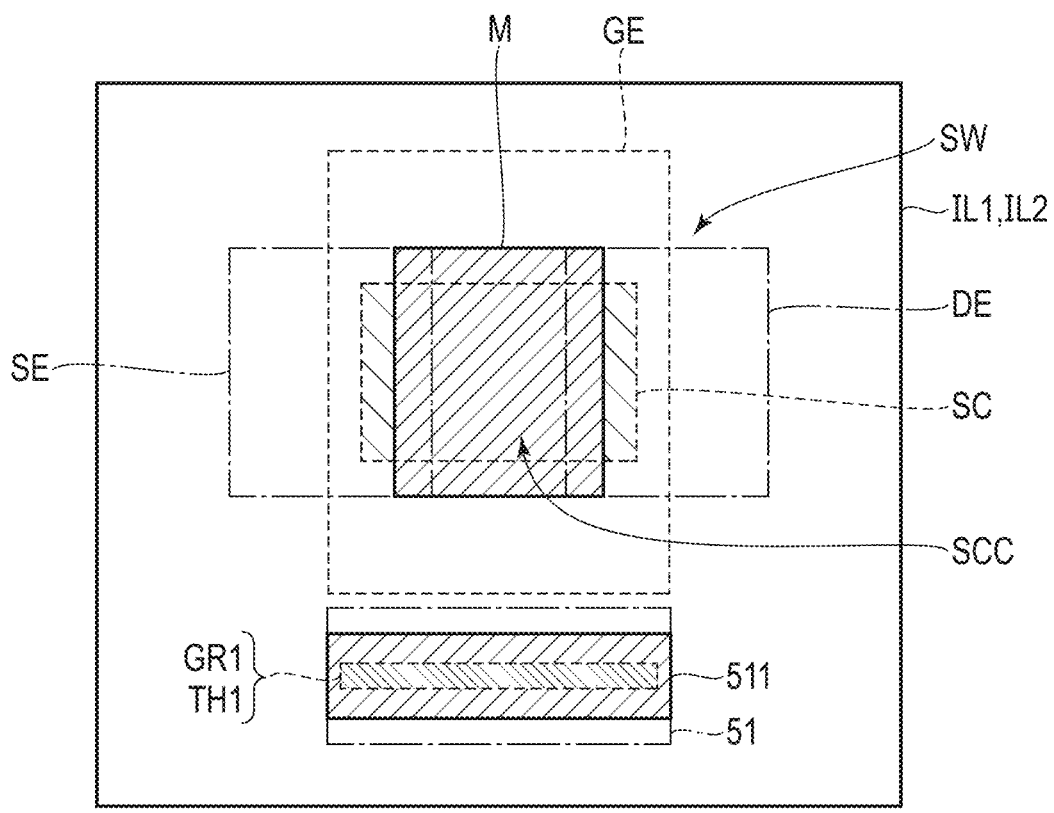
FIG. 11 is a diagram for explaining Configuration Example 3 including a switching element SW.

FIG. 11 is a diagram for explaining Configuration Example 3 including the switching element SW.

Configuration Example 3 differs from Configuration Example 1 in that an upper light-shielding wall 511 and a metal layer M are disposed. The configuration of the switching element SW is the same as in Configuration Example 1 described with reference to FIG. 4. The metal layer M overlaps a channel SCC of an oxide semiconductor SC in planar view. In the illustrated example, the metal layer M overlaps a part of a source electrode SE and a part of a drain electrode DE, respectively.

A second inorganic insulating film IL2 has a first through hole TH1 that overlaps a first groove GR1. The first through hole TH1 extends in the first direction X and has a width equivalent to that of the first groove GR1.

The upper light-shielding wall 511 is disposed in a manner filling the entire first through hole TH1, and overlaps a first light-shielding wall 51. The upper light-shielding wall 511 extends in the first direction X and has a width equivalent to that of the first light-shielding wall 51.

One end portion of each of the first light-shielding wall 51 and the upper light-shielding wall 511 extending in the first direction X faces a source electrode SE in the second direction Y. The other end portion of each of the first light-shielding wall 51 and the upper light-shielding wall 511 faces a drain electrode DE in the second direction Y. The channel SCC and the metal layer M face the first light-shielding wall 51 and the upper light-shielding wall 511 in the second direction Y.

Embodiment 3 will now be explained.

Figure 12:
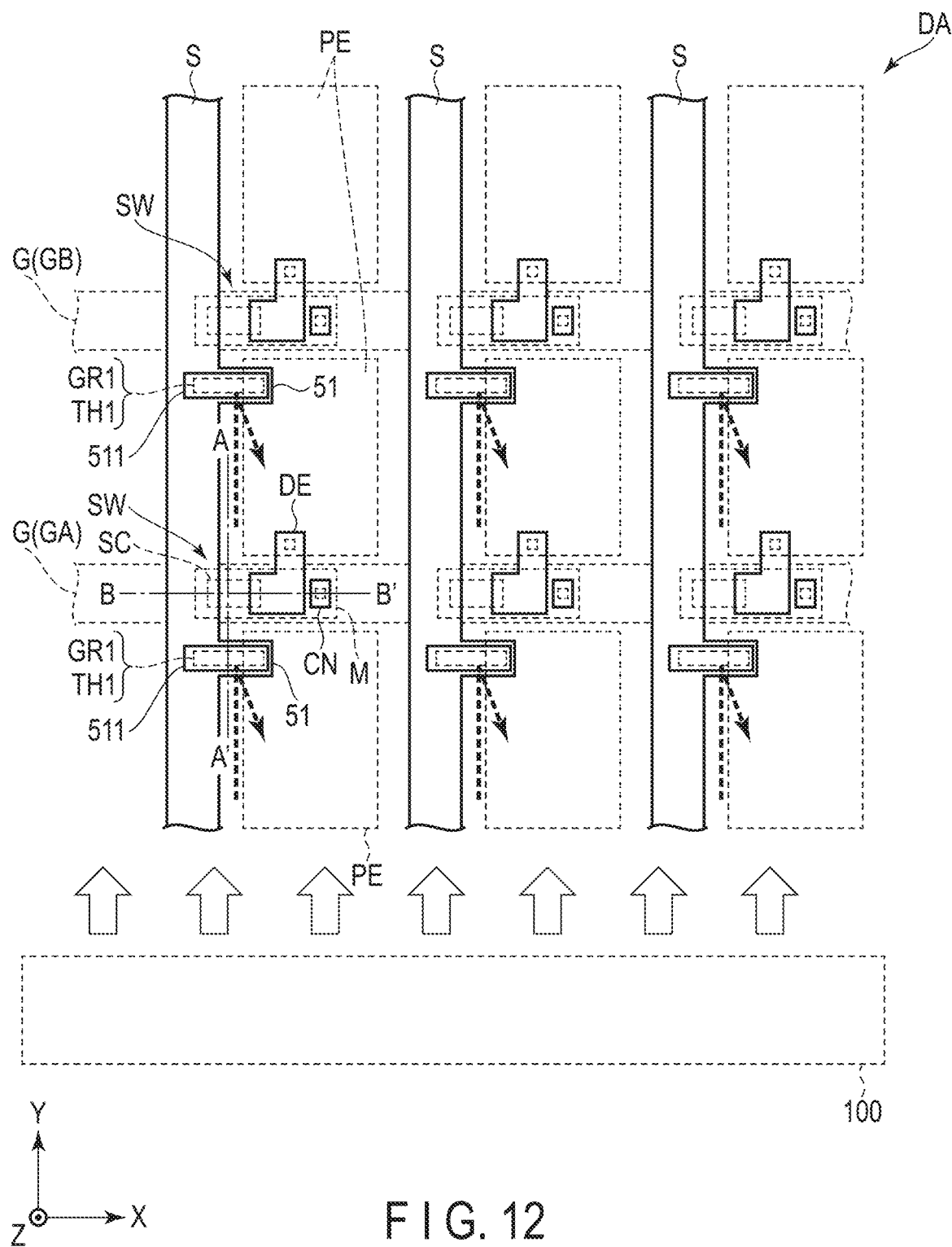
FIG. 12 is a plan view showing an example of a display area DA.

FIG. 12 is a plan view showing an example of the display area DA. Here, only a main part included in the first substrate SUB1 is shown.

A connecting electrode CN overlaps the scanning line G. The connecting electrode CN and the drain electrode DE are arranged in the first direction X. The metal layer M overlaps the scanning line G and extends in the first direction X. The metal layer M also overlaps a part of the signal line S, the oxide semiconductor SC, a part of the drain electrode DE, and the connecting electrode CN.

The first light-shielding wall 51 is integrally formed with the signal line S. The upper light-shielding wall 511 overlaps the first light-shielding wall 51 and the signal line S. The upper light-shielding wall 511 is separated from the metal layer M.

In each pixel PX, the upper light-shielding wall 511 (or the first through hole TH1) is located between two adjacent scanning lines G in the same manner as the first light-shielding wall 51 described in Configuration Example 1. For example, focusing on the first light-shielding wall 51 and the first groove GR1 located between scanning lines GA and GB, these upper light-shielding wall 511 and first through hole TH1 are close to the scanning line GB.

A pitch of the upper light-shielding walls 511 (or the first through holes TH1) arranged in the second direction Y is equivalent to a pixel pitch in the second direction Y, and is also equivalent to a pitch of the scanning lines G.

In such a layout, an illumination light emitted from the light-emitting module 100 travels along the second direction Y as shown by the dotted arrows, and is blocked by the first light-shielding wall 51 and the upper light-shielding wall 511 in the vicinity of the switching element SW. This prevents the illumination light from reaching the switching element SW, especially the oxide semiconductor SC.

Figure 13:
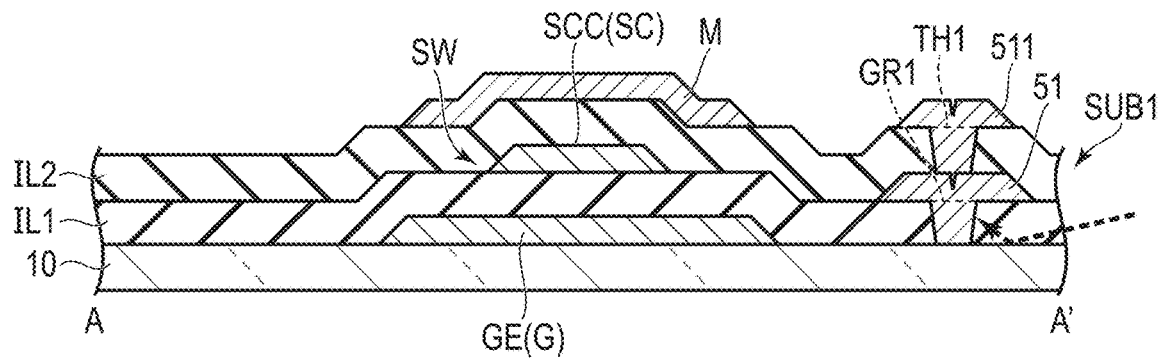
FIG. 13 is a cross-sectional view of a first substrate SUB1 including a switching element SW, a first light-shielding wall 51, and an upper light-shielding wall 511 along line A-A' shown in FIG. 12.
Figure 14:
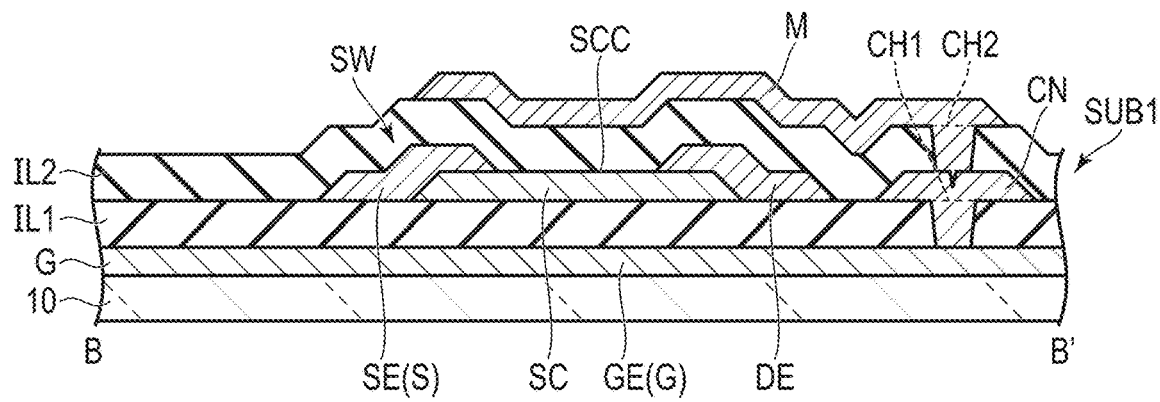
FIG. 14 is a cross-sectional view of the first substrate SUB1 including the switching element SW along line B-B' shown in FIG. 12.

FIG. 13 is a cross-sectional view of the first substrate SUB1 including the switching element SW, the first light-shielding wall 51, and the upper light-shielding wall 511 along line A-A' shown in FIG. 12. FIG. 14 is a cross-sectional view of the first substrate SUB1 including the switching element SW along line B-B' shown in FIG. 12.

In the second inorganic insulating film IL2, the first through hole TH1 is formed directly above the first groove GR1 and penetrates to the first light-shielding wall 51. The upper light-shielding wall 511 is disposed in the first through hole TH1 and is in contact with the first light-shielding wall 51. Of the upper light-shielding wall 511, a portion filled in the first through hole TH1 corresponds to a portion that blocks the light propagating through the second inorganic insulating film IL2.

The connecting electrode CN is disposed in a contact hole CH1 that penetrates the first inorganic insulating film IL1, and is in contact with the scanning line G. The connecting electrode CN is located in the same layer as a source electrode SE and the drain electrode DE, and is formed of the same material as the source electrode SE and the drain electrode DE. The connecting electrode CN is also formed of the same material as the first light-shielding wall 51.

The metal layer M is disposed on the second inorganic insulating film IL2 and is located directly above the channel SCC. Furthermore, the metal layer M extends directly above the connecting electrode CN, is disposed in a contact hole CH2 that penetrates the second inorganic insulating film IL2, and is in contact with the connecting electrode CN. As a result, the metal layer M is electrically connected to the scanning line G. The metal layer M is located in the same layer as the upper light-shielding wall 511, and is formed of the same material as the upper light-shielding wall 511.

The upper light-shielding wall 511 and the metal layer M are configured, for example, by a molybdenum-based material/aluminum-based material/molybdenum-based material stacked layer body. Note that, the materials used to form the upper light-shielding wall 511 are not limited to the above example. From the viewpoint of suppressing stray light due to reflection, it is desirable that the upper light-shielding wall 511 be formed of a material with low reflectivity such as titanium, molybdenum, or tungsten.

The upper light-shielding wall 511 is in contact with the first light-shielding wall 51 which is integrated with the signal line S, and is electrically connected to the signal line S. Therefore, the upper light-shielding wall 511 is separated from the metal layer M electrically connected to the scanning line G.

According to the above example, among the illumination light, the light propagating through the first inorganic insulating film IL1 is blocked by the first light-shielding wall 51. Also, the light propagating through the second inorganic insulating film IL2 is blocked by the upper light-shielding wall 511. Therefore, the same effect as described above can be obtained.

The technical concept of Configuration Example 3 described here can be applied to Configuration Example 2 above, and an upper light-shielding wall overlapping a second light-shielding wall 52 may be added.

CONFIGURATION EXAMPLE 3; MODIFIED EXAMPLE

FIG. 15 is a diagram for explaining a modified example including the switching element SW.

The modified example is different from Configuration Example 1 in that, in addition to the upper light-shielding wall 511 and the metal layer M, a lower light-shielding wall 512 is disposed. The configuration of the switching element SW is the same as in Configuration Example 1 described with reference to FIG. 4. The upper light-shielding wall 511 and the metal layer M are as described in Configuration Example 3 above.

The lower light-shielding wall 512 overlaps a first light-shielding wall 51 and an upper light-shielding wall 511. The lower light-shielding wall 512 extends in the first direction X. In addition, the lower light-shielding wall 512 is separated from a gate electrode GE.

One end portion of each of the first light-shielding wall 51, the upper light-shielding wall 511, and the lower light-shielding wall 512 extending in the first direction X faces a source electrode SE in the second direction Y. In addition, the other end portion of each of the first light-shielding wall 51, the upper light-shielding wall 511, and the lower light-shielding wall 512 faces a drain electrode DE in the second direction Y. A channel SCC and the metal layer M face the first light-shielding wall 51, the upper light-shielding wall 511, and the lower light-shielding wall 512 in the second direction Y.

A modified example will now be described.

Figure 16:
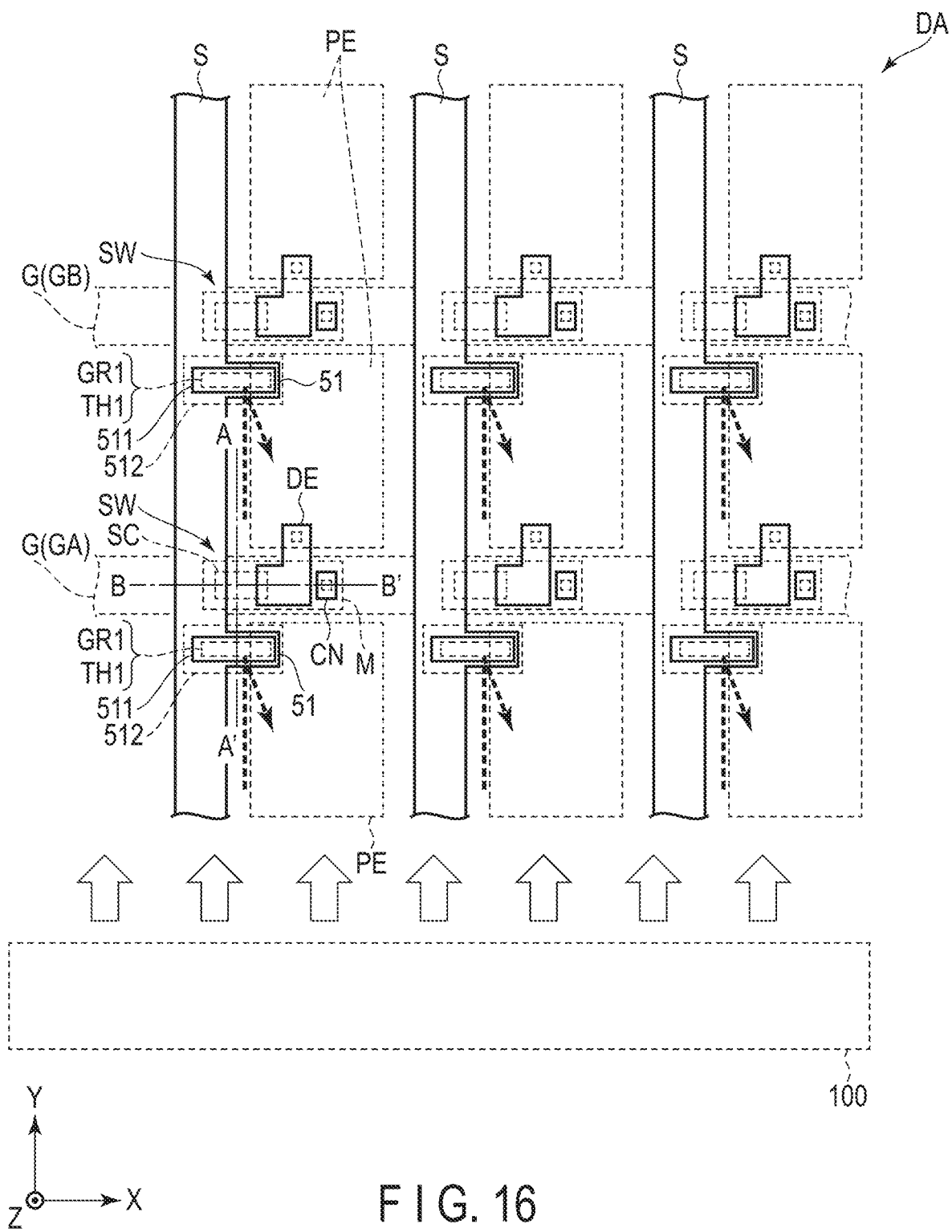
FIG. 16 is a plan view showing an example of a display area DA.

FIG. 16 is a plan view showing an example of the display area DA. Here, only a main part included in the first substrate SUB1 is shown.

The first light-shielding wall 51 is integrally formed with the signal line S. The upper light-shielding wall 511 and the lower light-shielding wall 512 overlap the first light-shielding wall 51 and the signal line S. The upper light-shielding wall 511 is separated from the metal layer M, and the lower light-shielding wall 512 is separated from the scanning line G.

Figure 17:
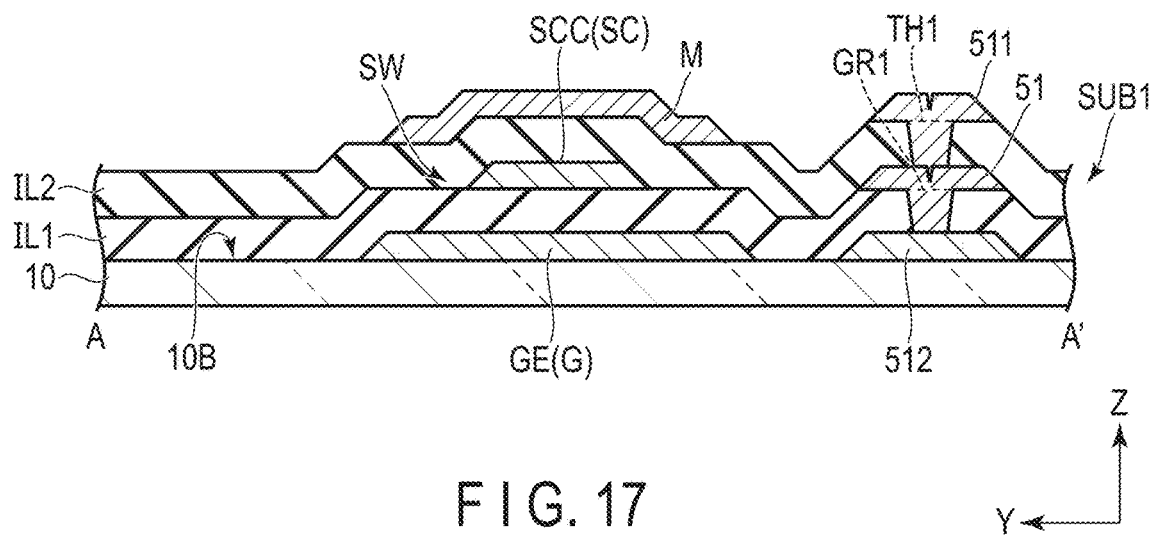
FIG. 17 is a cross-sectional view of a first substrate SUB1 including a switching element SW, a first light-shielding wall 51, an upper light-shielding wall 511, and a lower light-shielding wall 512 along line A-A' shown in FIG. 16.

FIG. 17 is a cross section of the first substrate SUB1 including the switching element SW, the first light-shielding wall 51, the upper light-shielding wall 511, and the lower light-shielding wall 512 along line A-A' shown in FIG. 16. Note that the cross section of the first substrate SUB1 including the switching element SW along line B-B' shown in FIG. 16 is as shown in FIG. 14; therefore, the drawing thereof is omitted.

The lower light-shielding wall 512 is separated from the scanning line G and the gate electrode GE, and is disposed between the first transparent substrate 10 and a first inorganic insulating film IL1. The lower light-shielding wall 512 is located in the same layer as the scanning line G and the gate electrode GE, and is formed of the same material as the scanning line G and the gate electrode GE.

In the first inorganic insulating film IL1, a first groove GR1 penetrates to the lower light-shielding wall 512. The first light-shielding wall 51 is disposed in the first groove GR1 and is in contact with the lower light-shielding wall 512.

In a second inorganic insulating film IL2, a first through hole TH1 is formed directly above the first groove GR1 and penetrates to the first light-shielding wall 51. The upper light-shielding wall 511 is disposed in the first through hole TH1 and is in contact with the first light-shielding wall 51. In this manner, in the modified example, the stacked layered body of the lower light-shielding wall 512, the first light-shielding wall 51, and the upper light-shielding wall 511 is configured to block the illumination light from the light-emitting module.

Even in such a modified example, the same effect as described above can be obtained.

The technical concept of the modified example of Configuration Example 3 described herein can be applied to Configuration Example 2 above, and the upper and lower light-shielding walls overlapping a second light-shielding wall 52 may be added.

CONFIGURATION EXAMPLE 4

Figure 18:
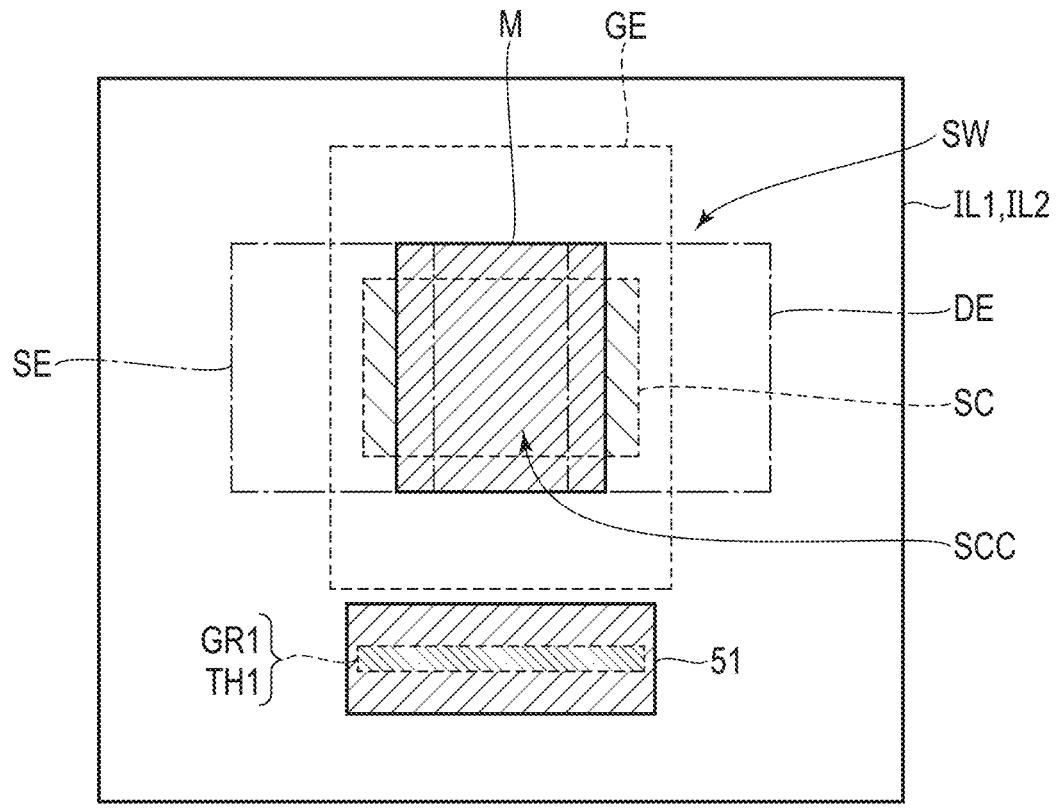
FIG. 18 is a diagram for explaining Configuration Example 4 including a switching element SW.
Figure 18:
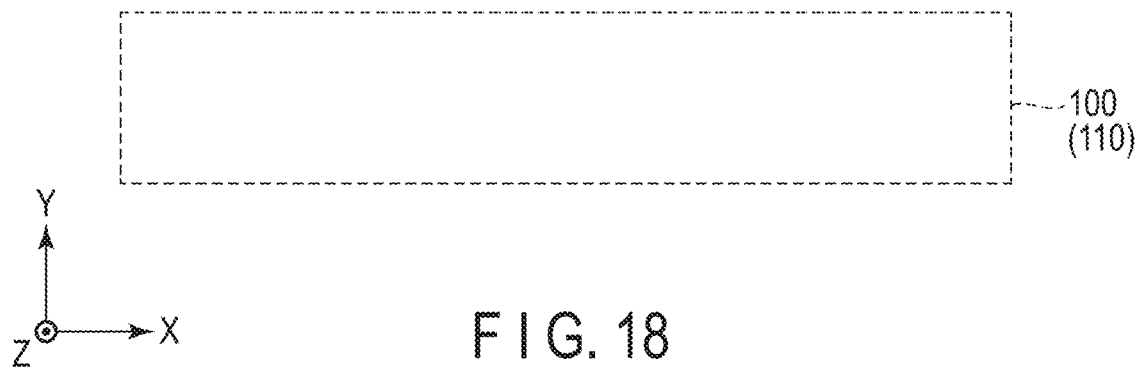

FIG. 18 is a diagram for explaining Configuration Example 4 including the switching element SW.

Configuration Example 4 differs from Configuration Example 1 in that a metal layer M is disposed, and a first light-shielding wall 51 is disposed in a first groove GR1 and a first through hole TH1. The configuration of the switching element SW is the same as in Configuration Example 1 described with reference to FIG. 4. The metal layer M overlaps a channel SCC of an oxide semiconductor SC in planar view.

A second inorganic insulating film IL2 has the first through hole TH1 that overlaps the first groove GR1. The first through hole TH1 extends in the first direction X and has a width equivalent to that of the first groove GR1.

A first light-shielding wall 51 is disposed in a manner filling the entire first groove GR1 and first through hole TH1. The first light-shielding wall 51 extends in the first direction X.

One end portion of the first light-shielding wall 51 extending in the first direction X faces a source electrode SE in the second direction Y. Furthermore, the other end portion of the first light-shielding wall 51 faces a drain electrode DE in the second direction Y. The channel SCC and the metal layer M face the first light-shielding wall 51 in the second direction Y.

Embodiment 4 will now be described.

Figure 19:
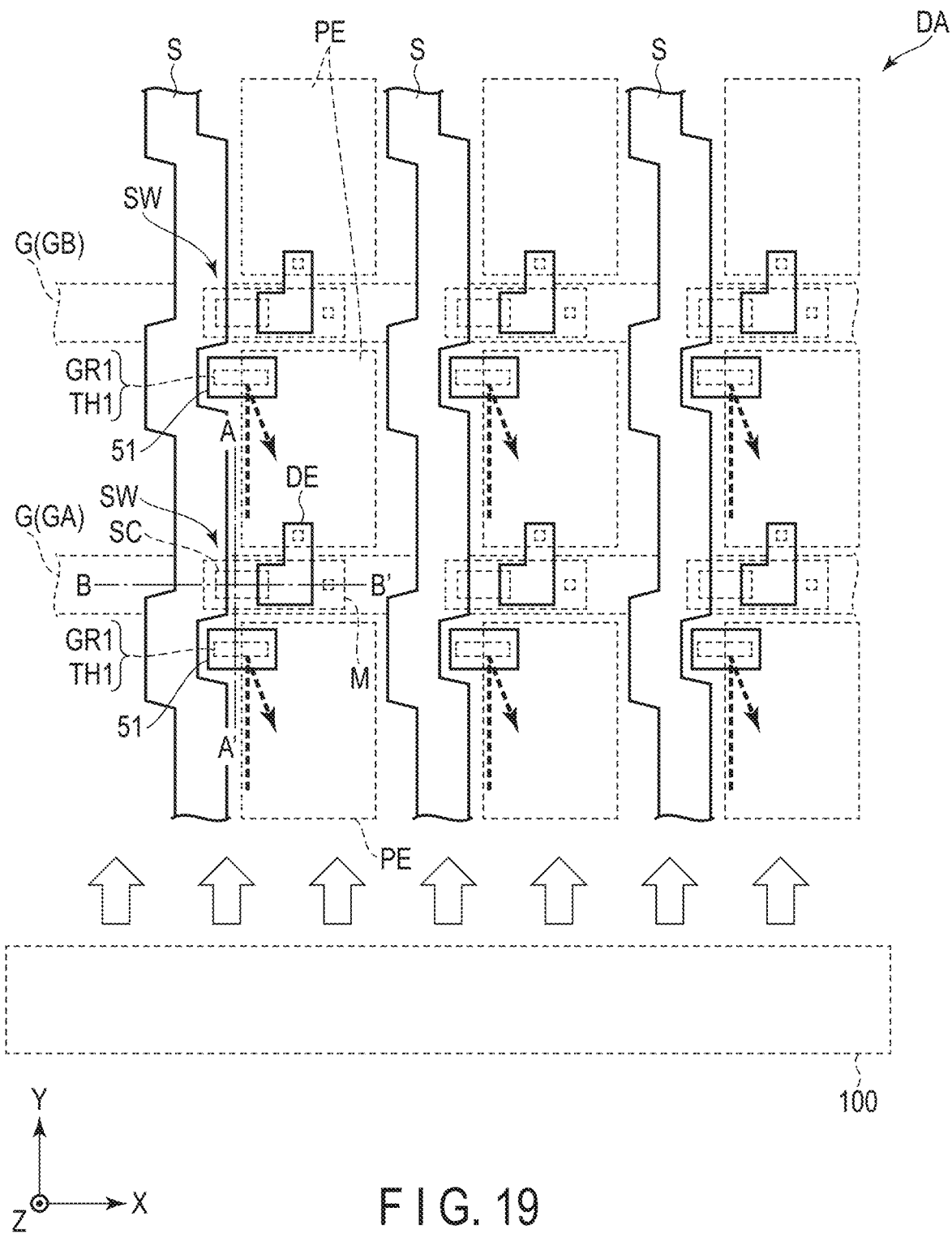
FIG. 19 is a plan view showing an example of a display area DA.

FIG. 19 is a plan view showing an example of the display area DA. Here, only a main part included in the first substrate SUB1 is shown.

The metal layer M overlaps the scanning line G and extends in the first direction X. The metal layer M further overlaps a part of the signal line S, the oxide semiconductor SC, and a part of the drain electrode DE.

The first light-shielding wall 51 is separated from the signal line S. The signal line S meanders so as to avoid the first light-shielding wall 51. Also, the first light-shielding wall 51 is separated from the metal layer M.

In each pixel PX, the first light-shielding wall 51 is located between two adjacent scanning lines G in the same manner as the first light-shielding wall 51 described in Configuration Example 1.

A pitch of the first light-shielding walls 51 arranged in the second direction Y is equivalent to a pixel pitch in the second direction Y, and is also equivalent to a pitch of the scanning lines G.

In such a layout, an illumination light emitted from the light-emitting module 100 travels along the second direction Y as shown by the dotted arrows, and is blocked by the first light-shielding wall 51 in the vicinity of the switching element SW. This prevents the illumination light from reaching the switching element SW, especially the oxide semiconductor SC.

Figure 20:
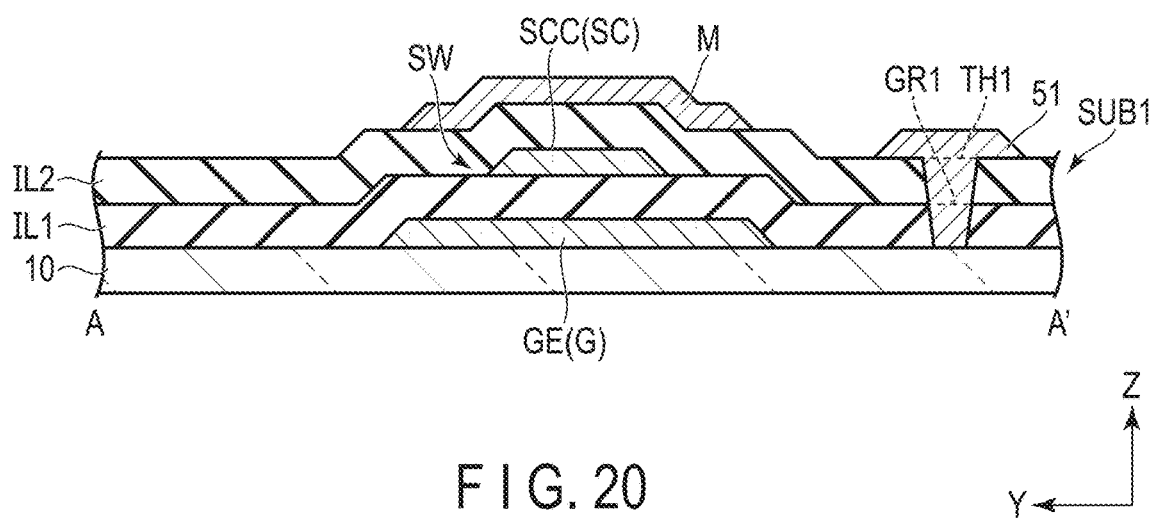
FIG. 20 is a cross-sectional view of a first substrate SUB1 including a switching element SW and a first light-shielding wall 51 along line A-A' shown in FIG. 19.
Figure 21:
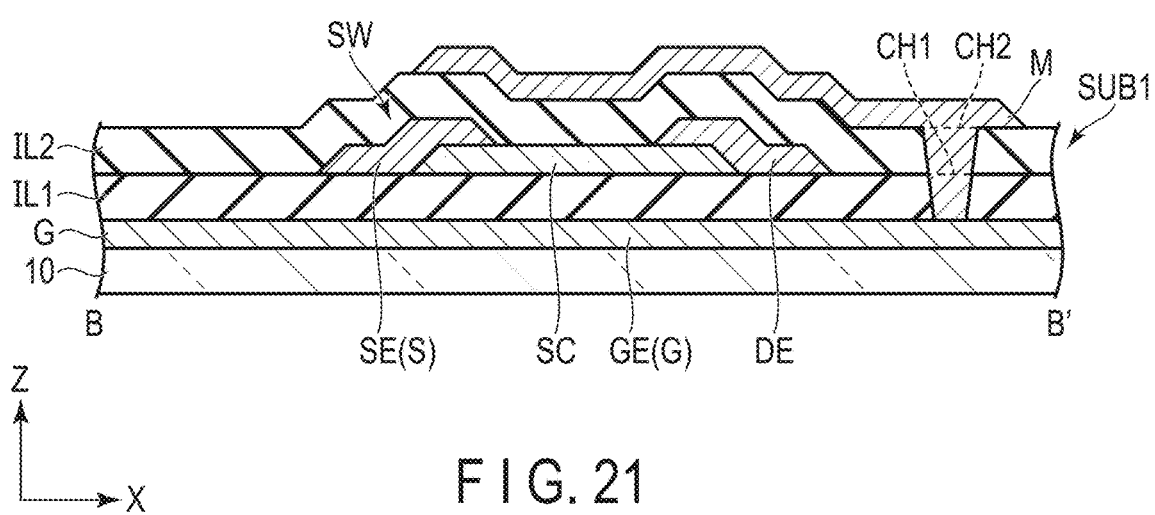
FIG. 21 is a cross-sectional view of the first substrate SUB 1 including the switching element SW along line B-B' shown in FIG. 19.

FIG. 20 is a cross-sectional view of the first substrate SUB1 including the switching element SW and the first light-shielding wall 51 along line A-A' shown in FIG. 19. FIG. 21 is a cross-sectional view of the first substrate SUB 1 including the switching element SW along line B-B' shown in FIG. 19.

In the second inorganic insulating film IL2, the first through hole TH1 is formed directly above the first groove GR1. The first groove GR1 and the first through hole TH1 penetrate to the first transparent substrate 10. The first light-shielding wall 51 is disposed in the first groove GR1 and the first through hole TH1, and is in contact with the first transparent substrate 10. Of the first light-shielding wall 51, a portion filled in the first groove GR1 corresponds to a portion that blocks the light propagating through a first inorganic insulating film IL1, and a portion filled in the first through hole TH1 corresponds to a portion that blocks the light propagating through the second inorganic insulating film IL2. Note that, when forming the first through hole TH1, without forming the first groove GR1, the first inorganic insulating film IL1 may be penetrated continuously with the second inorganic insulating film IL2 so that the second inorganic insulating film IL2 and the first inorganic insulating film IL1 are collectively opened by the first through hole TH1.

The metal layer M is disposed on the second inorganic insulating film IL2 and is located directly above the channel SCC. In addition, the metal layer M extends directly above the scanning line G, is disposed in a contact hole CH1 penetrating through the first inorganic insulating film IL1 and a contact hole CH2 penetrating through the second inorganic insulating film IL2, and is in contact with the scanning line G. As a result, the metal layer M is electrically connected to the scanning line G. The metal layer M is located in the same layer as the first light-shielding wall 51, and is formed of the same material as the first light-shielding wall 51. Note that when forming the contact hole CH2, without forming the contact hole CH1, the first inorganic insulating film IL1 may be penetrated continuously with the second inorganic insulating film IL2 so that the second inorganic insulating film IL2 and the first inorganic insulating film IL1 are collectively opened by the contact hole CH2.

As described above, the first light-shielding wall 51 is separated from the signal line S. For this reason, the first light-shielding wall 51 may be connected to the metal layer M electrically connected to the scanning line G.

According to the example described above, among the illumination light, the light propagating through the first inorganic insulating film IL1 and the light propagating through the second inorganic insulating film IL 2 are blocked by the first light-shielding wall 51. Therefore, the same effect as described above can be obtained.

Embodiment 5 will now be described.

Figure 22:
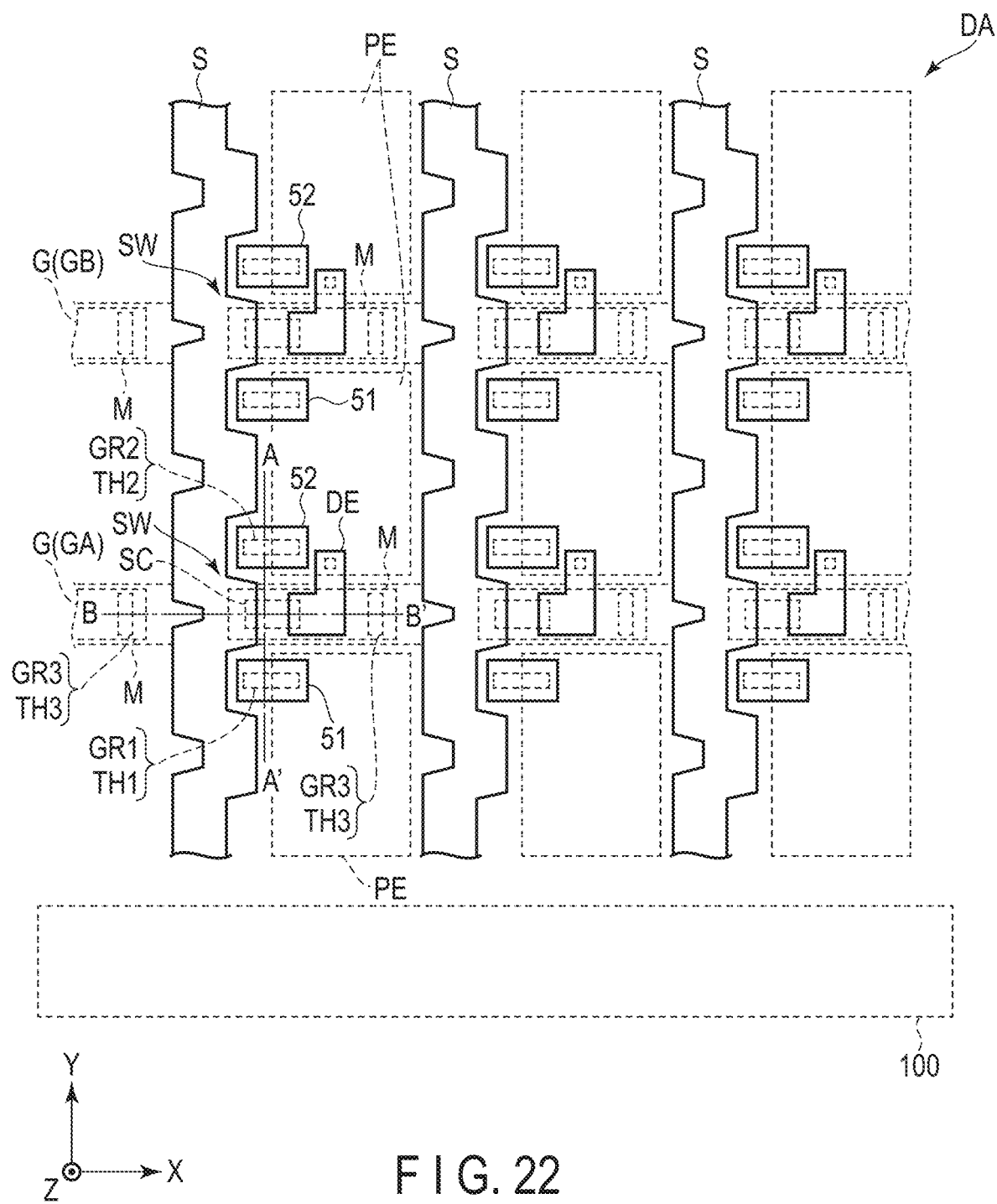
FIG. 22 is a plan view showing of an example of a display area DA.

FIG. 22 is a plan view showing an example of the display area DA. Here, only a main part included in the first substrate SUB1 is shown.

The first substrate SUB1 comprises, in addition to the first light-shielding wall 51 described above, a second light-shielding wall 52, and a metal layer M.

In planar view, the first groove GR1 and the first through hole TH1 overlap each other, a second groove GR2 and a second through hole TH2 overlap each other, and a third groove GR3 and a third through hole TH3 overlap each other. The first groove GR1, the first through hole TH1, the second groove GR2, and the second through hole TH2 extend in the first direction X, respectively. The third groove GR3 and the third through hole TH3 extend in the second direction Y.

The oxide semiconductor SC is located between the first groove GR1 (first through hole TH1) and the second groove GR2 (second through hole TH2) in the second direction Y. In addition, the oxide semiconductor SC is located between a signal line S and the third groove GR3 (third through hole TH3) in the first direction X.

The first light-shielding wall 51 is disposed in the first groove GR1 and the first through hole TH1, and the second light-shielding wall 52 is disposed in the second groove GR2 and the second through hole TH2. The oxide semiconductor SC is located between the first light-shielding wall 51 and the second light-shielding wall 52 in the second direction Y. The first light-shielding wall 51 and the second light-shielding wall 52 are separated from the metal layer M. In addition, the first light-shielding wall 51 and the second light-shielding wall 52 are separated from the signal line S. The signal line S meanders to avoid the first light-shielding wall 51 and the second light-shielding wall 52.

The metal layer M overlaps the scanning line G and extends in the first direction X. The metal layer M further overlaps a part of the signal line S, the oxide semiconductor SC, and a part of the drain electrode DE. The metal layer M is disposed on the third groove GR3 and the third through hole TH3.

A pitch between the first light-shielding wall 51 (or the first groove GR1) and the second light-shielding wall 52 (or the second groove GR2) sandwiching one oxide semiconductor SC is smaller than a pixel pitch in the second direction Y and smaller than a pitch of the scanning lines G.

A pitch between the signal line S and the third groove GR3 sandwiching one oxide semiconductor SC is smaller than the pixel pitch in the first direction X and smaller than a pitch of the signal lines S.

In such a layout, among the illumination light emitted from the light-emitting module 100, in addition to the light traveling along the second direction Y, the light traveling along the first direction X due to scattering or reflection is also blocked in the vicinity of the switching element SW. This prevents the illumination light from reaching the switching element SW, especially the oxide semiconductor SC.

Figure 23:
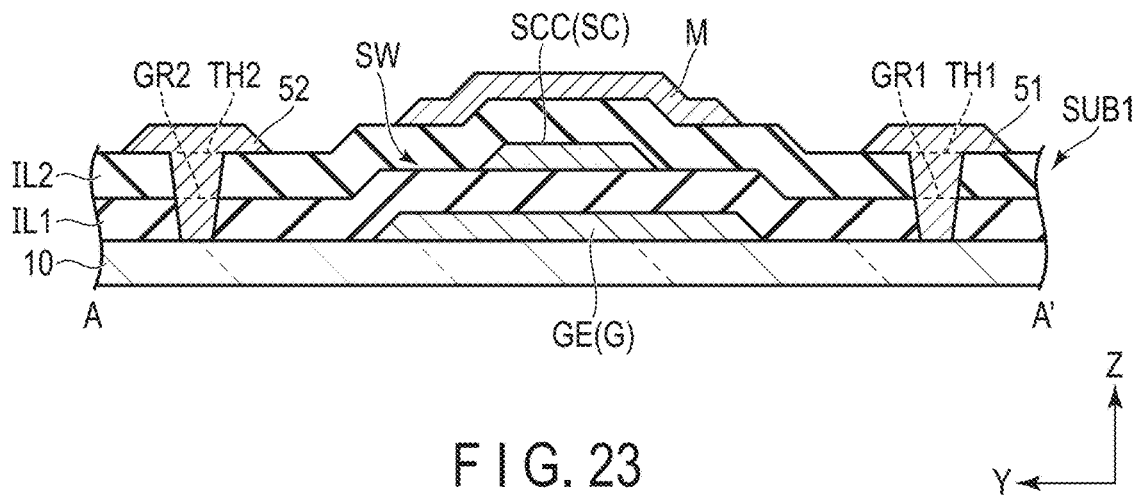
FIG. 23 is a cross-sectional view of a first substrate SUB1 including a switching element SW, a first light-shielding wall 51, and a second light-shielding wall 52 along line A-A' shown in FIG. 22.
Figure 24:
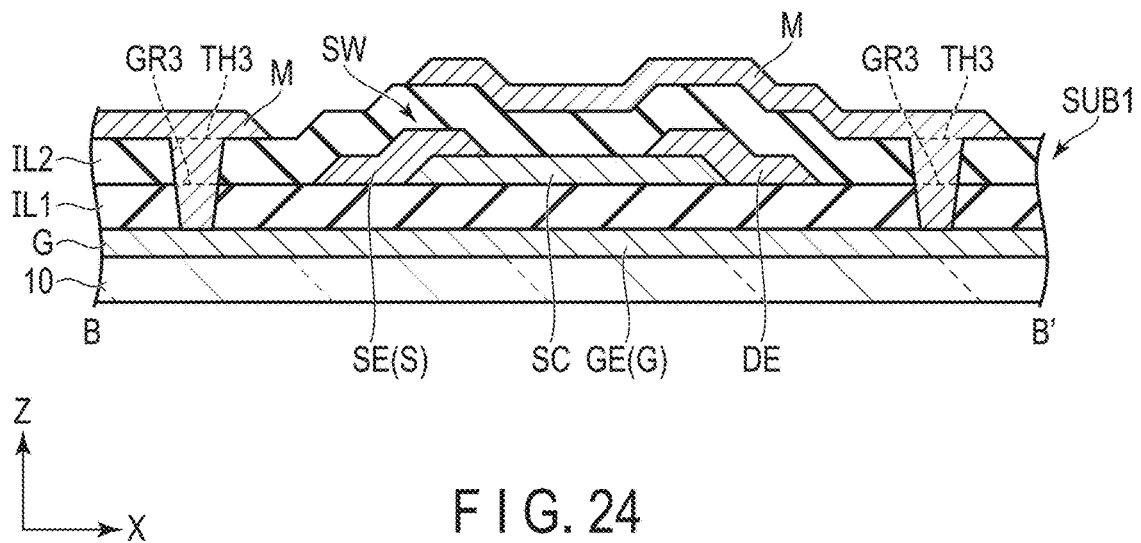
FIG. 24 is a cross-sectional view of the first substrate SUB1 including the switching element SW along line B-B' shown in FIG. 22.

FIG. 23 is a cross-sectional view of the first substrate SUB1 including the switching element SW, the first light-shielding wall 51, and the second light-shielding wall 52 along line A-A' shown in FIG. 22. FIG. 24 is a cross-sectional view of the first substrate SUB1 including the switching element SW along line B-B' shown in FIG. 22.

In a first inorganic insulating film IL1, the first groove GR1, the second groove GR2, and the third groove GR3 penetrate to the first transparent substrate 10. In the second inorganic insulating film IL2, the first through hole TH1 is formed directly above the first groove GR1, the second through hole TH2 is formed directly above the second groove GR2, and the third through hole TH3 is formed directly above the third groove GR3. Note that, when forming the first through hole TH1, the second through hole TH2, and the third through hole TH3, the first inorganic insulating film IL1 may be penetrated continuously with the second inorganic insulating film IL2 without forming the first groove GR1, the second groove GR2, and the third groove GR3 so that each of the second inorganic insulating film IL2 and the first inorganic insulating film IL1 is collectively opened by the first through hole TH1, the second through hole TH2, and the third through hole TH3.

The first light-shielding wall 51 is disposed in the first groove GR1 and the first through hole TH1, and is in contact with the first transparent substrate 10. The second light-shielding wall 52 is disposed in the second groove GR2 and the second through hole TH2, and is in contact with the first transparent substrate 10. The first light-shielding wall 51 and the second light-shielding wall 52 are separated from the metal layer M.

The metal layer M is disposed in the third groove GR3 and the third through hole TH3, and is in contact with the scanning line G. As a result, the metal layer M is electrically connected to the scanning line G. The metal layer M is located in the same layer as the first light-shielding wall 51 and the second light-shielding wall 52, and is formed of the same material as the first light-shielding wall 51 and the second light-shielding wall 52.

Of the first light-shielding wall 51, a portion filled in the first groove GR1 corresponds to a portion that blocks the light propagating through the first inorganic insulating film IL1, and a portion filled in the first through hole TH1 corresponds to a portion that blocks the light propagating through the second inorganic insulating film IL2. Of the second light-shielding wall 52, a portion filled in the second groove GR2 corresponds to a portion that blocks the light propagating through the first inorganic insulating film IL1, and a portion filled in the second through hole TH2 corresponds to a portion that blocks the light propagating through the second inorganic insulating film IL2. Of the metal layer M, a portion filled in the third groove GR3 corresponds to a portion that blocks the light propagating through the first inorganic insulating film IL1, and a portion filled in the third through hole TH3 corresponds to a portion that blocks the light propagating through the second inorganic insulating film IL2.

According to the example described above, among the illumination light, the light propagating through the first inorganic insulating film IL1 and the light propagating through the second inorganic insulating film IL 2 are blocked by the first light-shielding wall 51, the second light-shielding wall 52, and the metal layer M. Therefore, the same effect as described above can be obtained.

Embodiment 6 will now be described.

FIG. 25 is a plan view showing an example of the display area DA. Here, only a main part included in the first substrate SUB1 is shown.

In addition to the first light-shielding wall 51, the second light-shielding wall 52, and the metal layer M described above, the first substrate SUB1 comprises an auxiliary metal layer AM.

In planar view, the first groove GR1 and the first through hole TH1 overlap each other, a second groove GR2 and a second through hole TH2 overlap each other, a third groove GR3 and a third through hole TH3 overlap each other, and a fourth groove GR4 and a fourth through hole TH4 overlap each other. The first groove GR1, the first through hole TH1, the second groove GR2, and the second through hole TH2 extend in the first direction X, respectively. The third groove GR3, the third through hole TH3, the fourth groove GR4, and the fourth through hole TH4 extend in the second direction Y.

The oxide semiconductor SC is located between the first groove GR1 (first through hole TH1) and the second groove GR2 (second through hole TH2) in the second direction Y. In addition, the oxide semiconductor SC is located between the third groove GR3 (third through hole TH3) and the fourth groove GR4 (fourth through hole TH4) in the first direction X.

The metal layer M and the auxiliary metal layer AM overlap the scanning line G. The metal layer M further overlaps a part of the signal line S, the oxide semiconductor SC, and a part of the drain electrode DE. The metal layer M is disposed on the third groove GR3 and the third through hole TH3. The auxiliary metal layer AM is separated from the metal layer M. Note that the auxiliary metal layer AM may be connected to the metal layer M. The auxiliary metal layer AM is disposed in the fourth groove GR4 and the fourth through hole TH4.

A pitch between the first light-shielding wall 51 (or the first groove GR1) and the second light-shielding wall 52 (or the second groove GR2) sandwiching one oxide semiconductor SC is smaller than a pixel pitch in the second direction Y and smaller than a pitch of the scanning lines G.

A pitch between the third and fourth grooves GR3 and GR4 sandwiching one oxide semiconductor SC is smaller than the pixel pitch in the first direction X and smaller than a pitch of the signal lines S.

In such a layout, among the illumination light emitted from the light-emitting module 100, in addition to the light traveling along the second direction Y, the light traveling along the first direction X due to scattering or reflection is also blocked in the vicinity of the switching element SW. This prevents the illumination light from reaching the switching element SW, especially the oxide semiconductor SC.

Figure 26:
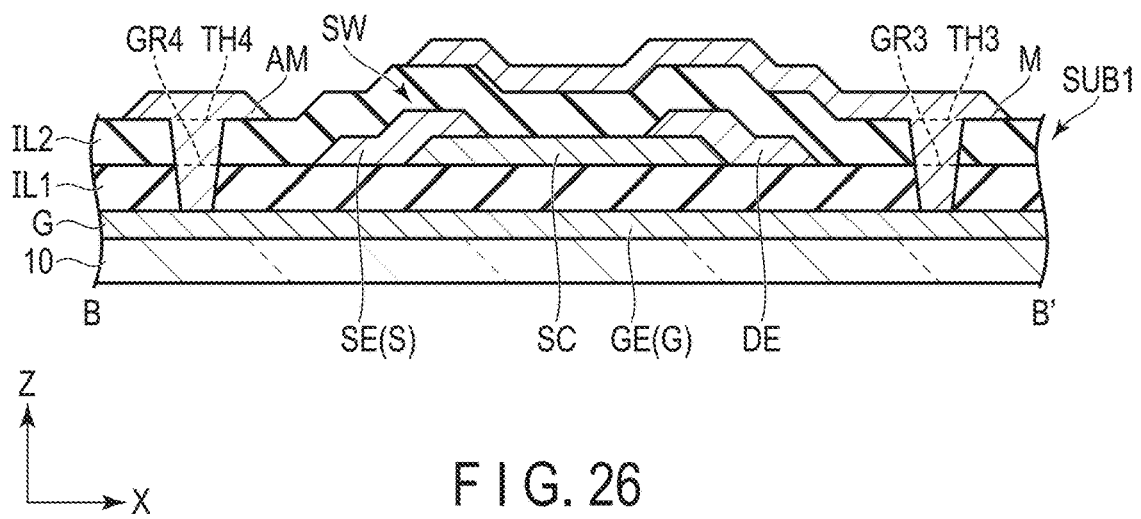
FIG. 26 is a cross-sectional view of a first substrate SUB1 including a switching element SW along line B-B' shown in FIG. 25.

FIG. 26 is a cross-sectional view of the first substrate SUB1 including the switching element SW along line B-B' shown in FIG. 25. Note that the cross section of the first substrate SUB1 including the switching element SW, the first light-shielding wall 51, and the second light-shielding wall 52 along line A-A' shown in FIG. 25 is as shown in FIG. 23; therefore, the drawing thereof is omitted.

In a first inorganic insulating film IL1, the third groove GR3 and the fourth groove GR4 penetrate to the first transparent substrate 10. In the second inorganic insulating film IL2, the third through hole TH3 is formed directly above the third groove GR3, and the fourth through hole TH4 is formed directly above the fourth groove GR4. Note that when forming the third through hole TH3 and the fourth through hole TH4, the first inorganic insulating film IL1 may be penetrated continuously with the second inorganic insulating film IL2 without forming the third groove GR3 and the fourth groove GR4 so that each of the second inorganic insulating film IL2 and the first inorganic insulating film IL1 is collectively opened by the third through hole TH3 and the fourth through hole TH4.

The metal layer M is disposed in the third groove GR3 and the third through hole TH3, and is in contact with the scanning line G. The auxiliary metal layer AM is disposed in the fourth groove GR4 and the fourth through hole TH4, and is in contact with the scanning line G. As a result, the metal layer M and the auxiliary metal layer AM are electrically connected to the scanning line G. The metal layer M and the auxiliary metal layer AM are located in the same layer as the first light-shielding wall 51 and the second light-shielding wall 52, and are formed of the same material as the first light-shielding wall 51 and the second light-shielding wall 52.

Of the metal layer M, a portion filled in the third groove GR3 corresponds to a portion that blocks the light propagating through the first inorganic insulating film IL1, and a portion filled in the third through hole TH3 corresponds to a portion that blocks the light propagating through the second inorganic insulating film IL2. Of the auxiliary metal layer AM, a portion filled in the fourth groove GR4 corresponds to a portion that blocks the light propagating through the first inorganic insulating film IL1, and a portion filled in the fourth through hole TH4 corresponds to a portion that blocks the light propagating through the second inorganic insulating film IL2.

According to the example described above, among the illumination light, the light propagating through the first inorganic insulating film IL1 and the light propagating through the second inorganic insulating film IL2 are blocked by the first light-shielding wall 51, the second light-shielding wall 52, the metal layer M, and the auxiliary metal layer AM. Therefore, the same effect as described above can be obtained.

<Embodiment of Display Device>

Next, an example of the display device DSP according to the present embodiment will be described.

Figure 27:
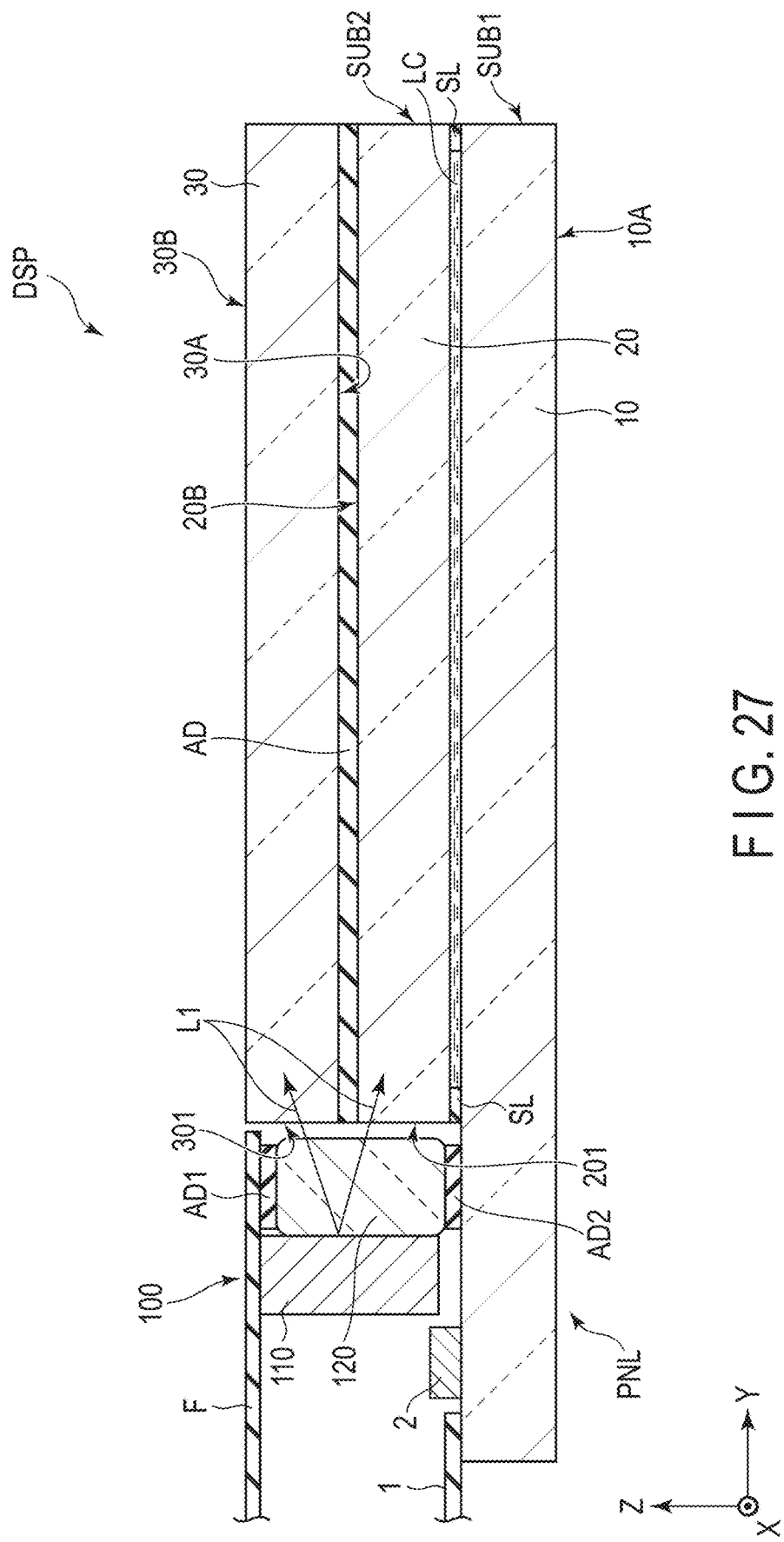
FIG. 27 is a cross-sectional view of a display device DSP.

FIG. 27 is a cross-sectional view of the display device DSP. Only a main part of the display panel PNL is shown in a simplified form.

In addition to the first substrate SUB1 and the second substrate SUB2, the display panel PNL comprises a third transparent substrate 30. A main surface (inner surface) 30A of the third transparent substrate 30 faces the main surface 20B of the second transparent substrate 20 in the third direction Z. An adhesive layer AD adheres the second transparent substrate 20 and the third transparent substrate 30. The third transparent substrate 30 is, for example, a glass substrate, but may also be an insulating substrate such as a plastic substrate. The third transparent substrate 30 has a refractive index equivalent to that of the first transparent substrate 10 and the second transparent substrate 20. The adhesive layer AD has a refractive index equivalent to that of each of the second transparent substrate 20 and the third transparent substrate 30.

A side surface 301 of the third transparent substrate 30 is located directly above a side surface 201 of the second transparent substrate 20. The light-emitting element 110 of the light-emitting module 100 is electrically connected to a wiring substrate F and is disposed between the first substrate SUB1 and the wiring substrate F in the third direction Z. The light guide 120 is disposed between the light-emitting element 110 and the side surface 201, and between the light-emitting element 110 and the side surface 301 in the second direction Y. The light guide 120 is adhered to the wiring substrate F by an adhesive layer AD1 and to the first substrate SUB1 by an adhesive layer AD2.

Next, with reference to FIG. 27, a light (the illumination light described above) L1 emitted from the light-emitting element 110 will be described.

The light-emitting element 110 emits the light L1 toward the light guide 120. The light L1 emitted from the light-emitting element 110 propagates along the direction of the arrow indicating the second direction Y, is transmitted through the light guide 120, is incident on the second transparent substrate 20 from the side surface 201, and is incident on the third transparent substrate 30 from the side surface 301. The light L1 incident on the second transparent substrate 20 and the third transparent substrate 30 propagates inside the display panel PNL while being repeatedly reflected. The light L1 incident on the liquid crystal layer LC to which no voltage is applied is transmitted through the liquid crystal layer LC with little scattering. The light L1 incident on the liquid crystal layer LC to which the voltage is applied is scattered by the liquid crystal layer LC.

The display device DSP is observable from the main surface 10A side of the first transparent substrate 10 and from a main surface 30B side of the third transparent substrate 30. In addition, even in a case where the display device DSP is observed from the main surface 10A side or the main surface 30B side, the background of the display device DSP can be observed through the display device DSP.

In such a display device DSP, as described above, the switching element SW of each pixel PX comprises a transparent oxide semiconductor SC, and the transmittance can also be improved by omitting the light-shielding layer overlapping the oxide semiconductor SC in the third direction Z.

As described above, according to the present embodiment, it is possible to provide a display device capable of suppressing a decrease in reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate comprising a first transparent substrate, a scanning line disposed on the first transparent substrate, a first inorganic insulating film disposed on the scanning line, a signal line disposed on the first inorganic insulating film and intersecting the scanning line, a switching element provided with an oxide semiconductor disposed on the first inorganic insulating film and electrically connected to the scanning line and the signal line, a pixel electrode electrically connected to the switching element, and a first light-shielding wall;
a second substrate comprising a second transparent substrate having a side surface, and a common electrode facing the pixel electrode;
a liquid crystal layer disposed between the first substrate and the second substrate and containing a polymer-dispersed liquid crystal; and
a light-emitting module disposed along the side surface, wherein
the first inorganic insulating film, in planer view, includes a first groove formed between the oxide semiconductor and the light-emitting module,
the first light-shielding wall is disposed on the first groove,
the first substrate further comprises a second inorganic insulating film disposed on the first inorganic insulating film, a metal layer disposed on the second inorganic insulating film, and an upper light-shielding wall,
the second inorganic insulating film includes a first through hole overlapping the first groove,
the upper light-shielding wall is disposed in the first through hole and overlaps the first light-shielding wall,
the first light-shielding wall is formed of the same material as the signal line, and
the upper light-shielding wall is formed of the same material as the metal layer.

2. The display device of claim 1, wherein
the switching element comprises a source electrode and a drain electrode arranged in a first direction,
the oxide semiconductor includes a channel between the source electrode and the drain electrode,
the first groove extends in the first direction, and
a width of the first groove along the first direction is larger than a width of the channel along the first direction.

3. The display device of claim 1, wherein the first light-shielding wall is integrally formed with the signal line.

4. The display device of claim 1, wherein
the first substrate further comprises a second light-shielding wall,
the first inorganic insulating film includes a second groove,
the second light-shielding wall is disposed in the second groove,
the oxide semiconductor is located between the first light-shielding wall and the second light-shielding wall, and
a pitch between the first light-shielding wall and the second light-shielding wall is smaller than a pixel pitch.

5. The display device of claim 4, wherein the first light-shielding wall and the second light-shielding wall are integrally formed with the signal line.

6. The display device of claim 1, wherein
the metal layer is electrically connected to the scanning line,
the first light-shielding wall is integrally formed with the signal line, and
the upper light-shielding wall is separated from the metal layer.

7. The display device of claim 1, wherein
the first substrate further comprises a lower light-shielding wall,
the lower light-shielding wall is formed of the same material as the scanning line, is separated from the scanning line, and is disposed between the first transparent substrate and the first inorganic insulating film, and
the first light-shielding wall overlaps the lower light-shielding wall.

8. A display device comprising:
a first substrate comprising a first transparent substrate, a scanning line disposed on the first transparent substrate, a first inorganic insulating film disposed on the scanning line, a signal line disposed on the first inorganic insulating film and intersecting the scanning line, a switching element provided with an oxide semiconductor disposed on the first inorganic insulating film and electrically connected to the scanning line and the signal line, a pixel electrode electrically connected to the switching element, and a first light-shielding wall;
a second substrate comprising a second transparent substrate having a side surface, and a common electrode facing the pixel electrode;
a liquid crystal layer disposed between the first substrate and the second substrate and containing a polymer-dispersed liquid crystal; and
a light-emitting module disposed along the side surface, wherein
the first inorganic insulating film, in planer view, includes a first groove formed between the oxide semiconductor and the light-emitting module,
the first light-shielding wall is disposed on the first groove,
the first substrate further comprises a second inorganic insulating film disposed on the first inorganic insulating film, and a metal layer disposed on the second inorganic insulating film,
the second inorganic insulating film includes a first through hole overlapping the first groove, and
the first light-shielding wall is formed of the same material as the metal layer and is disposed in the first groove and the first through hole.

9. The display device of claim 8, wherein
the metal layer is electrically connected to the scanning line, and
the first light-shielding wall is separated from the signal line.

10. A display device comprising:
a first substrate comprising a first transparent substrate, a scanning line disposed on the first transparent substrate, a first inorganic insulating film disposed on the scanning line, a signal line disposed on the first inorganic insulating film and intersecting the scanning line, a switching element provided with an oxide semiconductor disposed on the first inorganic insulating film and electrically connected to the scanning line and the signal line, a pixel electrode electrically connected to the switching element, and a first light-shielding wall;

a second substrate comprising a second transparent substrate having a side surface, and a common electrode facing the pixel electrode;
a liquid crystal layer disposed between the first substrate and the second substrate and containing a polymer-dispersed liquid crystal; and
a light-emitting module disposed along the side surface, wherein
the first inorganic insulating film, in planer view, includes a first groove formed between the oxide semiconductor and the light-emitting module,
the first light-shielding wall is disposed on the first groove,
the first substrate further comprises a second inorganic insulating film disposed on the first inorganic insulating film, a metal layer disposed on the second inorganic insulating film, and a second light-shielding wall,
the first inorganic insulating film includes a second groove and a third groove,
the second inorganic insulating film includes a first through hole overlapping the first groove, a second through hole overlapping the second groove, and a third through hole overlapping the third groove,
the first groove and the second groove extend in a first direction,
the third groove extends in a second direction intersecting the first direction,
the first light-shielding wall and the second light-shielding wall are formed of the same material as the metal layer,
the first light-shielding wall is disposed in the first groove and the first through hole,
the second light-shielding wall is disposed in the second groove and the second through hole,
the metal layer is disposed in the third groove and the third through hole, and
the oxide semiconductor is located between the first groove and the second groove in the second direction, and between the signal line and the third groove in the first direction.

11. The display device of claim 10, wherein a pitch between the first groove and the second groove in the second direction is smaller than a pixel pitch.

12. The display device of claim 10, wherein
the first substrate further comprises an auxiliary metal layer disposed on the second inorganic insulating film,
the first inorganic insulating film includes a fourth groove,
the second inorganic insulating film includes a fourth through hole overlapping the fourth groove,
the fourth groove extends in the second direction,
the auxiliary metal layer is disposed in the fourth groove and the fourth through hole, and
the oxide semiconductor is located between the third groove and the fourth groove in the first direction.

13. The display device of claim 12, wherein
in the second direction, a pitch between the first groove and the second groove is smaller than a pixel pitch, and
in the first direction, a pitch between the third groove and the fourth groove is smaller than a pixel pitch.

14. The display device of claim 8, wherein, in planar view, the signal line meanders and is separated from the first light-shielding wall.

15. The display device of claim 10, wherein, in planar view, the signal line meanders and is separated from the first light-shielding wall.

16. The display device of claim 1, wherein an interval between the oxide semiconductor and the first groove is 1 to 25 μm.

* * * * *